United States Patent
Maxon et al.

(10) Patent No.: US 12,332,309 B2
(45) Date of Patent: Jun. 17, 2025

(54) BUILT-IN SELF-TEST FOR NETWORK ON CHIP FABRIC

(71) Applicant: Intel Corporation, Santa Clara, CA (US)

(72) Inventors: Dawn Maxon, San Jose, CA (US); Eric A. Norige, Santa Clara, CA (US); Joji Philip, San Jose, CA (US); William John Bainbridge, Palo Alto, CA (US); Joseph B. Rowlands, Alviso, CA (US)

(73) Assignee: Intel Corporation, Santa Clara, CA (US)

( * ) Notice: Subject to any disclaimer, the term of this patent is extended or adjusted under 35 U.S.C. 154(b) by 798 days.

(21) Appl. No.: 17/399,942

(22) Filed: Aug. 11, 2021

(65) Prior Publication Data
US 2021/0373075 A1   Dec. 2, 2021

(51) Int. Cl.
*G01R 31/28*    (2006.01)
*G01R 31/3187*  (2006.01)

(52) U.S. Cl.
CPC ..... *G01R 31/3187* (2013.01); *G01R 31/2856* (2013.01)

(58) Field of Classification Search
USPC .......................................... 716/51, 136, 138
See application file for complete search history.

(56) References Cited

U.S. PATENT DOCUMENTS

| | | | |
|---|---|---|---|
| 2013/0159799 A1* | 6/2013 | Brown | G06F 11/2242 714/E11.155 |
| 2014/0254388 A1 | 9/2014 | Kumar et al. | |
| 2015/0036536 A1 | 2/2015 | Kumar et al. | |
| 2017/0061041 A1 | 3/2017 | Kumar et al. | |
| 2017/0061053 A1 | 3/2017 | Kumar et al. | |
| 2018/0183672 A1 | 6/2018 | Norige et al. | |
| 2018/0219738 A1 | 8/2018 | Bainbridge et al. | |
| 2018/0302293 A1 | 10/2018 | Raponi et al. | |
| 2018/0324113 A1 | 11/2018 | Norige et al. | |
| 2019/0260504 A1* | 8/2019 | Philip | H04L 1/0041 |

OTHER PUBLICATIONS

Bhowmik, Biswajit, et al.; "Dugdugi: An Optimal Fault Addressing Scheme for Octagon-Like On-Chip Communication Networks," IEEE Transactions on Very Large Scale Integration (VLSI) Systems, vol. 29, No. 5; May 2021; 14 pages.

(Continued)

*Primary Examiner* — Brian Ngo
(74) *Attorney, Agent, or Firm* — Alliance IP, LLC

(57) ABSTRACT

A system comprising a network-on-chip (NOC) fabric comprising a plurality of routes to communicate data between a plurality of agents; a plurality of built-in self-test (BIST) generators, wherein a BIST generator of the plurality of BIST generators is coupled between an agent of the plurality of agents and the NOC fabric and is to transmit at least one test pattern through the NOC fabric; and a plurality of BIST checkers, wherein a BIST checker of the plurality of BIST checkers is coupled between the agent of the plurality of agents and the NOC fabric and is to receive at least one test pattern through the NOC fabric from at least one of the plurality of BIST generators and to verify whether the at least one test pattern was transmitted correctly through the NOC fabric.

20 Claims, 10 Drawing Sheets

(56) References Cited

OTHER PUBLICATIONS

EPO; Extended European Search Report issued in EP Patent Application No. 22184021.8, dated Dec. 20, 2022; 8 pages.
Grecu, Cristian, et al.; "BIST for Network-on-Chip Interconnect Infrastructures," 24th IEEE VLSI Test Symposium; Apr. 2006, 8 pages.
Zhan, Junkai, et al.; "Online Path-based Test Method for Network-on-Chip," 2019 IEEE International Symposium on Circuits and Systems, May 26, 2019; 5 pages.

* cited by examiner

BUILT-IN SELF-TEST FOR NETWORK ON CHIP FABRIC

FIELD

The present disclosure relates in general to the field of computer development, and more specifically, to a built-in self-test (BIST) system for network on chip fabric.

BACKGROUND

Semiconductor defects in transport fabrics can be missed during a manufacturing test, and then be detected later in a system test, or worse, by a customer. In addition, faults can be introduced into semiconductors by use over time. Specifically, there are three points in time when having good test coverage for a system may be important: during manufacturing test, when the system is powered on initially, and (e.g., for mission-critical applications like the automotive ecosystem) when the system is deployed in mission mode.

BRIEF DESCRIPTION OF THE DRAWINGS

Like reference numbers and designations in the various drawings indicate like elements.

DETAILED DESCRIPTION

Figure 1:
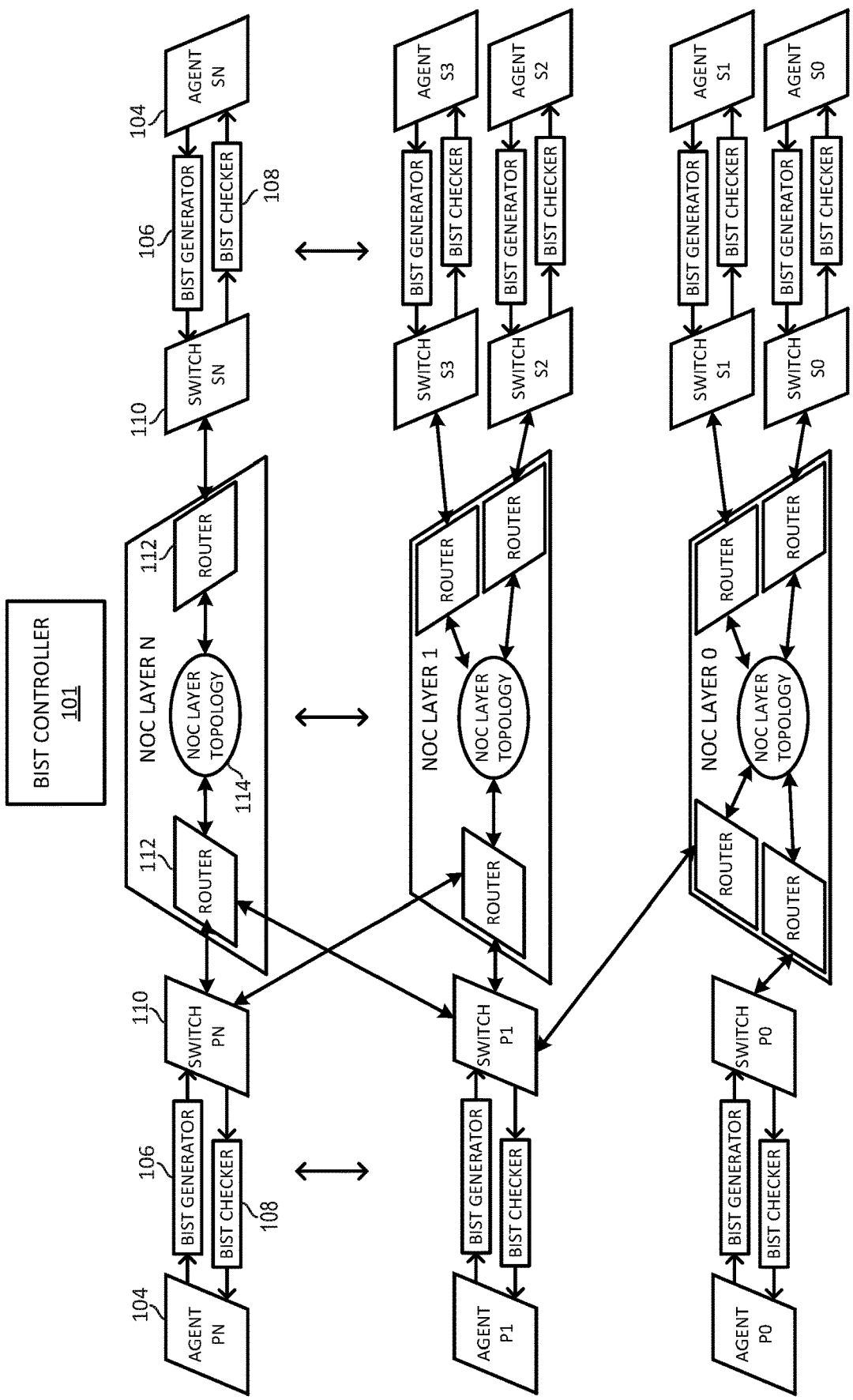
FIG. 1 illustrates a computing system comprising a built-in self-test (BIST) system for a network on chip (NOC) fabric in accordance with various embodiments.

FIG. 1 illustrates a system 100 comprising a built-in self-test (BIST) system for a network on chip (NOC) fabric in accordance with various embodiments. In the embodiment depicted, the system 100 includes a BIST controller 101, various agents 104, BIST generators 106, BIST checkers 108, switches 110, routers 112, and NOC layer topologies 114.

The system 100 includes three primary agents (P0, P1, and PN) and five secondary agents (S0, S1, S2, S3, SN) (although any suitable number of agents 104 may be present in other embodiments), where designation of an agent as primary or secondary may be based on which agent is initiating a communication session at any particular instance in time (e.g., the agent initiating the communication session may be the primary agent and the other agent involved in the communication session may be the secondary agent). Thus, in some embodiments, the designation of an agent as primary or secondary may be temporal in nature. The system 100 also includes three NOC layers (e.g., 0, 1, and N) providing interconnect fabric between the agents 104 (in other embodiments a NOC fabric may include any suitable number of layers). In the embodiment depicted, primary agent P0 has routes to only secondary agents S0 and S1, primary agent P1 has routes to all of the secondary agents, and primary agent PN has routes to S2, S3 and SN.

Testing of the transport fabric is an important function in the manufacturing phase as well as the operational phase of a system. If early testing overlooks defects that are found later, the cost to remedy the defects (both in terms of time and materials) rises. Moreover, for mission critical interconnects, an undetected defect may prove dangerous or otherwise detrimental to the system.

In various embodiments of the present disclosure, system 100 comprises a BIST system (e.g., comprising BIST controller 101 and various BIST generators 106 and BIST checkers 108) that provides the ability to test routes between agents 104 including testing of transport links, data storage structures (e.g., buffers in the interconnect), and sequential elements (e.g., pipeline stages on the transport links) in a NOC fabric at the functional clock speed of the NOC, regardless of fabric topology or protocols used by agents 104. The BIST system may be flexible, providing for testing of the entire fabric (e.g., all configured routes) or configurable subsets of the fabric, both during manufacturing, at power-on, and after deployment (even allowing for testing when normal traffic is being sent by the agents 104 across the NOC). In various embodiments, the BIST system may be configured to test all NOC routes between all agents of network transport links, regardless of changing widths (upsizing or downsizing) of network transport links or depth of storage buffers along the links through the fabric. In some embodiments, the packet lengths used by the BIST system may be configured to ensure 100% test coverage in minimal time (e.g., packets may include exactly enough flits to cover all bits of the widest links and all locations of the deepest storage on each route). In various embodiments, the BIST system may also allow for specialized test patterns (e.g., customized by architects) to target specific faults, using custom-generated packet sizes that minimize the runtime while achieving maximal coverage.

In various embodiments, the BIST system may provide one or more advantages, such as reducing undetected errors in manufacturing, reducing testing time, and improving functional safety in systems that include transport fabrics.

In various embodiments, the BIST system is designed using a NOC design tool. The NOC design tool may comprise any suitable logic (e.g., a software program, full computing system, etc.). The NOC design tool may allow a design architect to specify fabric parameters of a NOC for a system (e.g., a system-on-a-chip (SOC)). Such parameters may include, e.g., an identification of any one or more of the agents to communicate over the NOC, which protocols are to be used by the agents, bandwidth requirements for one or more agents, latency requirements for one or more agents, connectivity between agents (e.g., which agents are connected to which other agents), data widths of the agents, burst sizes for one or more of the agents, and packet sizes for one or more of the agents. Using the specified parameters, the NOC design tool may design NOC components, such as the agents 104, switches 110, routers 112, NOC layer topologies 114, other NOC components, or a subset of these NOC components (or portions of NOC components).

The design output by the NOC design tool may have any suitable format. In one embodiment, the output may be in a hardware description language (HDL) such as Verilog or Very High-Speed Integrated Circuit Hardware Description Language (VHDL). In one example, the output is register-transfer level (RTL) code. In various embodiments, the output of the NOC design tool may be used as an input for the circuit-level design of the NOC, for example, via a design compiler. The output may also include synthesis collateral including constraints for the design specified by the output code. In some embodiments, the output of the NOC design tool may take another form, such as an intermediate language between an input RTL representation and a target netlist, such as A Flexible Intermediate Representation for RTL (FIRRTL) or RTL Intermediate Language (RTLIL). In yet other embodiments, the output of the NOC design tool could include a circuit design for some or all of the components of the NOC. In some embodiments, the NOC design tool may access a parameterized library of RTL components to instantiate and configure the components of the NOC to comply with the NOC specifications, such as the agent protocol requirements, transport connectivity, bandwidth, and quality of service requirements between the various agents of the system (e.g., SOC).

In various embodiments, the BIST system is also generated (e.g., instantiated in the code) and configured by the NOC design tool and is included in the output of the NOC design tool. The BIST system may comprise a BIST controller 101, a plurality of BIST generators 106, and a plurality of BIST checkers 108. In one embodiment, a BIST generator 106 and BIST checker may be generated for each agent 104 that communicates through the fabric of the NOC. The BIST controller 101 is responsible for initiating a BIST run. In various embodiments, the BIST controller 101 may also be responsible for aggregating the results of the run.

The BIST generators 106 are instantiated on the transmit (TX) links between each agent 104 and the NOC fabric. For example, a BIST generator 106 may be coupled between a bridge of the agent that the generator is associated with and a switch 110 which couples the BIST generator 106 to the fabric of the NOC. The BIST generators 106 create data packets to test the transport fabric. The BIST checkers 108 are instantiated on the receive (RX) links between each agent 104 and the NOC fabric. For example, a BIST checker 108 may be coupled between a bridge of the agent that the checker is associated with and a switch 110 which couples the BIST checker 108 to the fabric of the NOC. A BIST checker 108 may check the BIST traffic received and report errors to the BIST controller 101. The NOC design tool may also instantiate all of the connectivity used for signaling between the BIST controller 101 and the BIST generators 106 and BIST checkers 108.

When instantiating a BIST generator 106 or a BIST checker 108, the NOC design tool may configure parameters of each generator 106 or checker 108 for its specific position in the NOC fabric. For example, the routing table on a BIST generator 106 may be configured according to its precise position in the NOC as each BIST generator 106 may transmit test data via one or more distinct routes. As another example, the expected total flit count for a BIST run may be configured for a BIST checker 108 based on its unique position within the NOC (e.g., since this count is based at least in part on how many BIST generators 106 will send test packets to the BIST checker 108).

Agent 104 may represent a communication endpoint in the system 100. For example, an agent 104 may represent a component of an SOC, such as a central processing unit (CPU), processor core, memory cache, graphics processing unit (GPU), network interface controller (NIC), memory controller, or other component. An agent may communicate through the NOC using any suitable protocol, such as Peripheral Component Interconnect (PCI) Express (PCIe), Quick Path Interconnect (QPI), Cache Coherent Interconnect for Accelerators (CCIX), Open Coherent Accelerator Processor Interface (OpenCAPI™), GenZ™, SuperSpeed Universal Serial Bus (USB), USB4, Compute Express Link (CXL), INTEL® $X^e$ Link, NVIDIA® NVLink®, or other suitable communication protocol. In some embodiments, an agent 104 may communicate through the NOC using multiple protocols and may comprise a bridge for each protocol (and thus a BIST generator 106 and BIST checker 108 may be generated for each of the protocols of the agent and may each be coupled to a respective bridge). The respective bridges may each formulate packets according to the particular protocol associated with the bridge.

A switch 110 may couple an agent 104 to one or more routers 112 of the NOC. In some embodiments, a switch is shared between multiple bridges of an agent. A switch 110 may enable packets to be sent from an agent via a selected physical network of multiple physical networks in the fabric of the NOC. In some embodiments (such as that shown), the switch 110 is coupled to routers 112 of different layers of the NOC. For example, the switch PN is coupled to routers of NOC layer N as well as NOC layer 1. In some embodiments, such switches may facilitate implementation of virtual channels of the NOC that are isolated from each other due to being implemented on different NOC layers. The NOC design tool may provide configurability of the switches enabling the switches to couple to one or more NOC layers.

A router 112 may be coupled to one or more switches 110 and a respective NOC layer topology 114. A NOC layer topology 114 may include various transport fabric components, such as routers, links, pipeline modules, buffers, link clock-crossing modules, or other suitable components.

Figure 2:
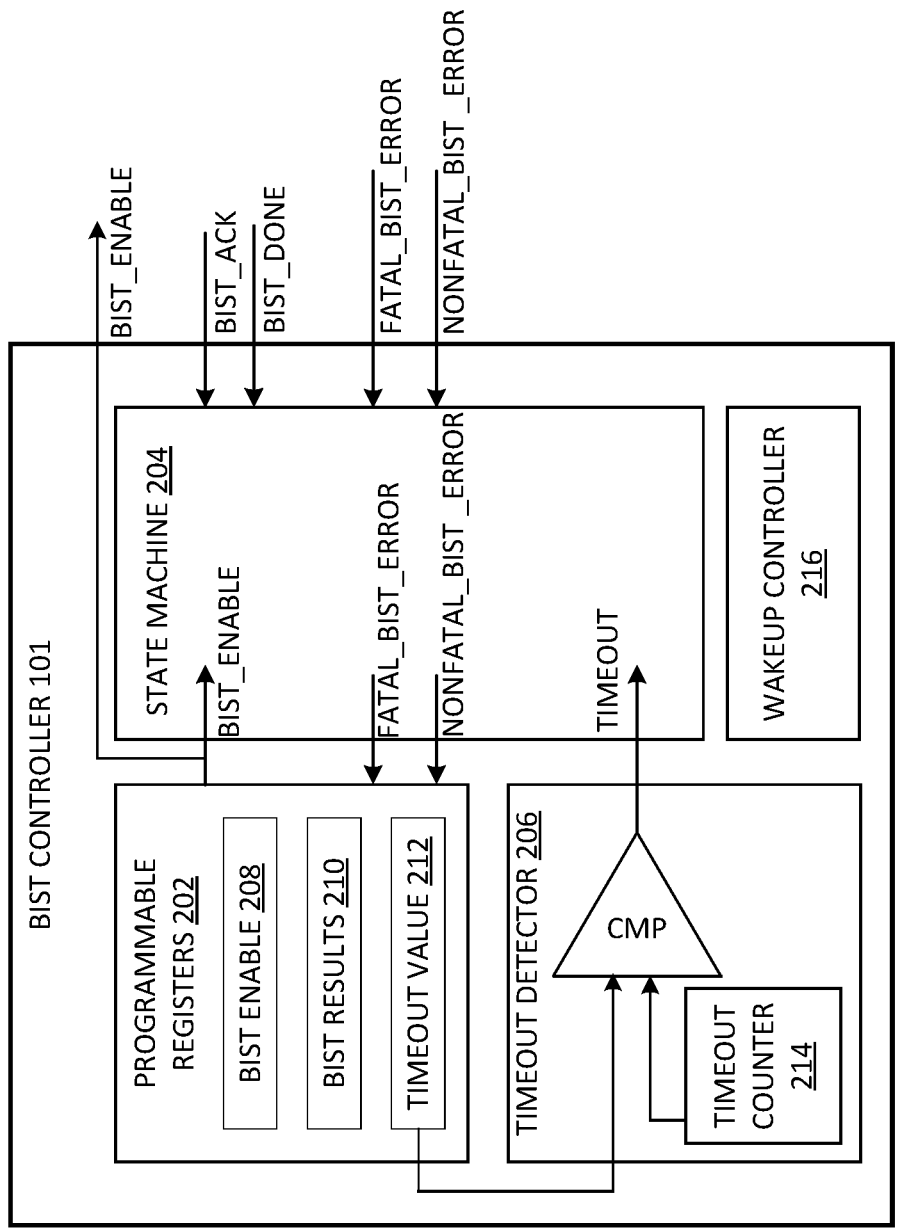
FIG. 2 illustrates a BIST controller in accordance with various embodiments.

FIG. 2 illustrates a BIST controller 101 in accordance with various embodiments. BIST controller 101 comprises programmable registers 202, state machine 204, timeout detector 206, and wakeup controller 216.

Programmable registers 202 include BIST enable register 208, BIST results register 210, and timeout value register 212. The programmable registers 202 may be programmed by any suitable component of the system 100, such as a CPU (not shown) of the system or via other suitable interface. For example, software instructions executed by system 100 may interact with programmable registers (e.g., by writing to the BIST enable register 208 or timeout value register 312 and reading from BIST results register 210).

BIST enable register 208 may be programmed (e.g., via a software write) to initiate a BIST run. In some embodiments, the BIST enable register 208 may be reset by the controller 101 once it has been determined that all BIST generators and checkers have received the BIST_ENABLE signal as indicated by the BIST_ACK signal (or at another suitable time). The BIST controller signaling handshake may support BIST generators 106 and BIST checkers 108 running in multiple clock domains or power domains. If any of the power domains included within the BIST run are asleep (e.g., when the BIST enable register 208 is written to), the wakeup controller 216 will initiate wake up for these domains before the BIST run begins. For example, the wakeup controller 216 may initiate the wakeup by communicating with a controller of the system 100 (e.g., a low power controller) that sends a wakeup signal to the sleeping domains involved in the BIST run. The BIST controller 101 asserts the BIST_ENABLE signal which is provided to all BIST generators 106 and checkers 108 to indicate that a new BIST run has started. When all BIST generators and checkers (or at least all BIST generators and checkers involved in the particular BIST run) have asserted their respective BIST_ACK signals, the BIST controller 101 deasserts the BIST_ENABLE signal. In some embodiments, the NOC design tool may implement the BIST_ACK signal into the BIST controller 101 as an AND tree to reduce top level wires (e.g., multiple BIST_ACK signals from BIST generators and/or checkers may be combined via an AND gate and then combined with the output of a similar AND gate and so on). As used herein, the term wire may be used to refer to a single physical wire or a wire pair (e.g., for a differential signal).

BIST results register 210 may store the results of the BIST run. For example, the BIST results register 210 may store error information, such as one or more of whether an error occurred during the BIST run, a type of error (e.g., fatal or non-fatal, a type of protocol violation, or other suitable error type information), a source of an error (e.g., which BIST checker 108 reported the error), or other suitable error information.

Timeout value register 212 may store timeout related information, such as a timeout value, the timeout value width (e.g., number of bits of the timeout value), or other timeout information (e.g., a time granularity of each bit in the timeout value). In various embodiments, the NOC design tool may configure the timeout value register 212 with the appropriate value(s) at the time of generation of the NOC. In various embodiments, the timeout value register 212 may be accessible via a software write (and thus could be user configurable).

State machine 204 may implement the BIST flow. It receives the BIST_ENABLE signal from register 208 and initiates a BIST run in response. The BIST_ENABLE signal may be sent to all of the BIST generators 106 and BIST checkers 108. The state machine 204 may wait for the BIST_ACK signal and then cause the BIST_ENABLE signal to be deasserted. When a BIST generator 106 or BIST checker 108 finishes its portion of the BIST run, it asserts its own BIST_DONE signal. In some embodiments, the NOC design tool may generate an AND tree for the BIST_DONE signals so that the BIST controller 101 receives a single BIST_DONE signal indicative of whether or not all BIST generators and BIST checkers have completed. In other embodiments, multiple BIST_DONE signals (e.g., from each generator and checker) could be provided to the BIST controller 101. When the BIST run is fully completed (e.g., as indicated by the BIST_DONE signal or when a fatal error occurs), the state machine 204 updates the BIST results register 210 with the test results and returns to an idle state. In other embodiments, the BIST results register 210 could be updated at another suitable time, such as responsive to an error signal being received.

The state machine may monitor the FATAL_BIST_ERROR and NONFATAL_BIST_ERROR signals to determine whether an error was detected by any of the BIST checkers 108. These signals could be aggregated or separate signals from the BIST checkers. A nonfatal BIST error occurs when packet corruption is present, but all BIST packets have arrived at their destinations. A BIST run can safely be rerun for nonfatal failures. A fatal BIST error occurs when BIST fails in such a way that the BIST run cannot be reliably rerun (e.g., because packets have been misrouted or cannot arrive at the intended destination because of faults). A BIST checker 108 may detect such an error when an expected number of flits is not received or when too many flits are received. When an error is received from a BIST checker 108 (e.g., via the FATAL_BIST_ERROR signal or the NONFATAL_BIST_ERROR signal), the state machine 204 may control the writing of the error information into BIST results register 210.

The BIST controller 101 can also detect a fatal error via a timeout mechanism. For example, timeout detector 206 may detect a hung BIST run. The timeout detector 206 accesses the timeout value and determines whether it has been exceeded by comparing it to a timeout counter 214 that begins when the BIST run starts. If the BIST_DONE signal is not asserted before the timeout value is reached, then a timeout occurs. The timeout may be indicative of one or more lost packets since if the expected number of flits isn't received by a BIST checker 108 then the BIST checker 108 won't assert its BIST_DONE signal. In various embodiments, an indication that the timeout occurred is stored in BIST results register 210.

Figure 3:
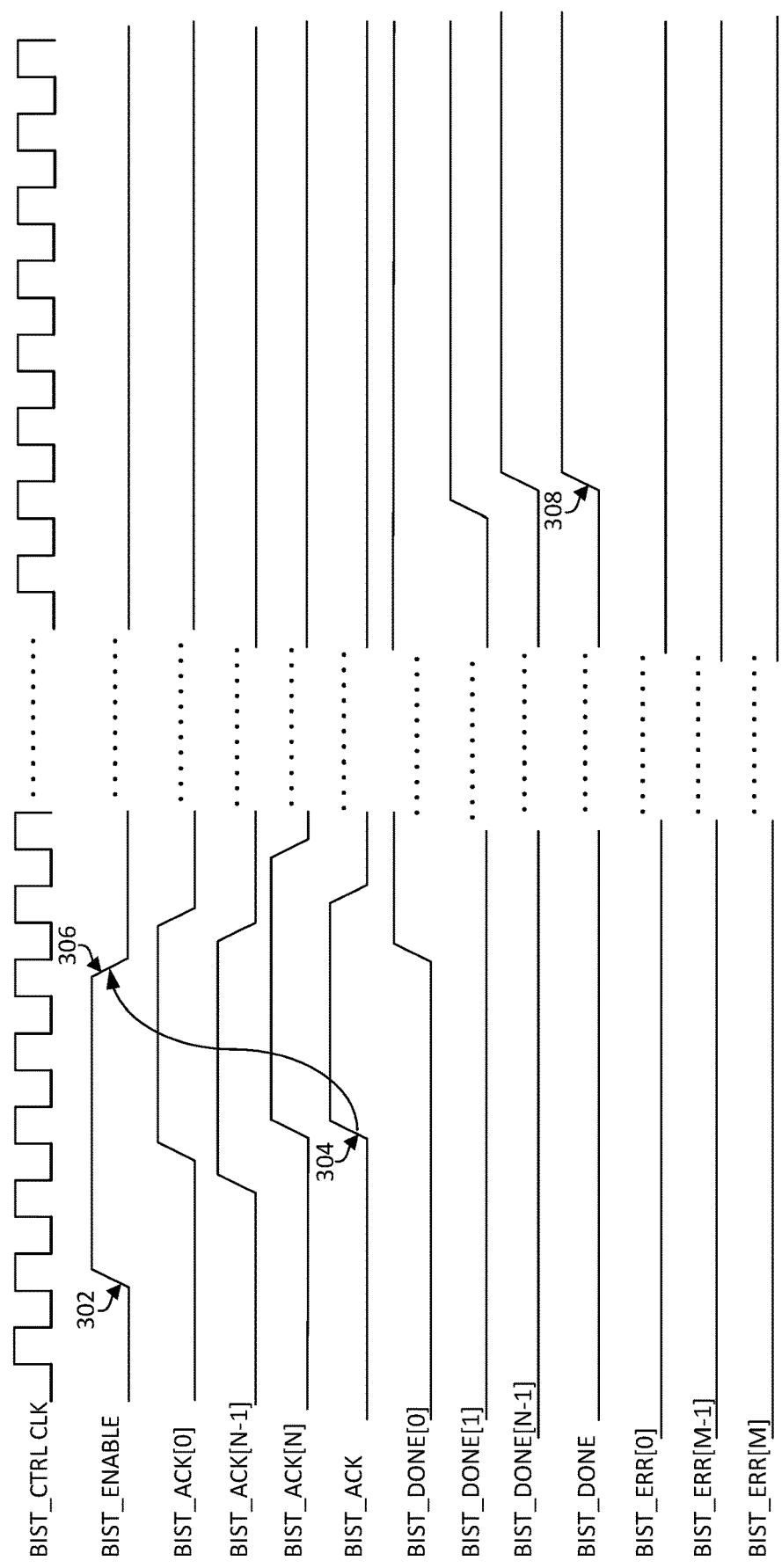
FIG. 3 illustrates a timing diagram of signals of a BIST controller in accordance with various embodiments.

FIG. 3 illustrates a timing diagram of signals of a BIST controller 101 in accordance with various embodiments. At 302, the BIST_ENABLE signal is asserted. In response, the BIST generators 106 and BIST checkers 108 may assert their respective BIST_ACK signals (represented as BIST_ACK[0] through BIST_ACK[N]). As a result of all of these signals being asserted, the BIST controller's BIST_ACK input signal is asserted at 304. After this signal is asserted, the BIST_ENABLE signal is deasserted at 306. As the BIST generators 106 and BIST checkers complete their BIST functions they assert their BIST_DONE signals (represented as BIST_DONE[0] through BIST_DONE[N]). As a result of all BIST_DONE signals being asserted, the BIST controller's BIST_DONE input signal is asserted at 308. The BIST_ERR signals (which could represent nonfatal or fatal errors) coming from the BIST checkers 108 all remain deasserted and the BIST run is considered successful.

Figure 4:
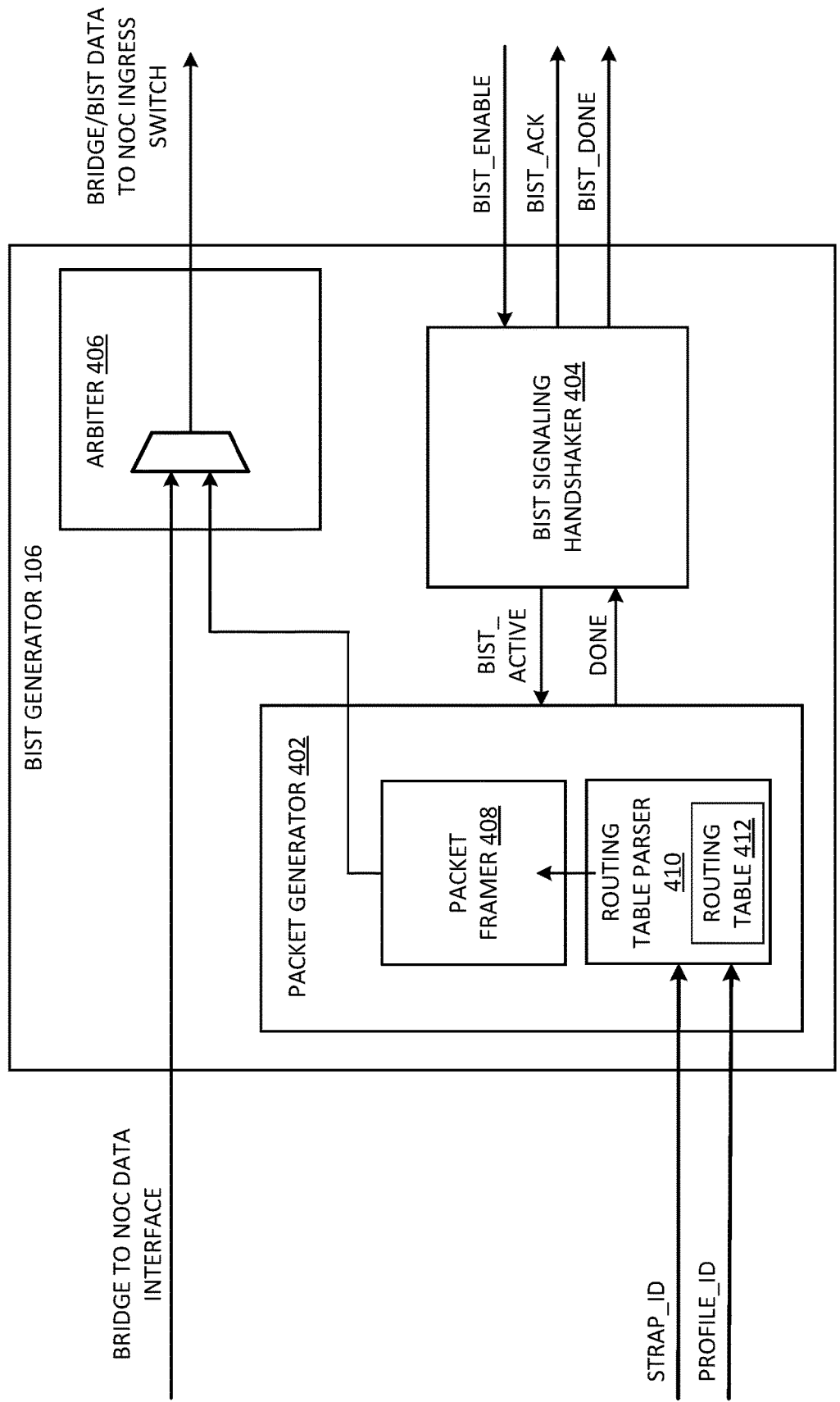
FIG. 4 illustrates a BIST generator in accordance with various embodiments.

FIG. 4 illustrates a BIST generator 106 in accordance with various embodiments. BIST generator 106 includes a packet generator 402, BIST signaling handshaker 404, and an arbiter 406. The packet generator includes a packet framer 408 and routing table parser 410.

A BIST generator 106 creates and transmits BIST packets based on a routing table 412 (which may be programmed by the NOC design tool). The packet generator 402 may create the packets using test patterns programmed by the NOC design tool (where the test patterns may be supplied, e.g., directly by the NOC design tool or by a user of the NOC design tool). The sizes of the packets generated by the packet framer 408 may be determined and configured by the NOC design tool to ensure test coverage across all buffers and paths without using packets that are bigger than needed.

The NOC design tool may configure the BIST generators 106 with the traffic patterns to send and the BIST checkers 108 with information needed to verify whether the traffic patterns were communicated successfully.

In various embodiments, the routing table parser 410 may loop through the routing table 412 once for each configured test pattern, select applicable routes over which the test pattern should be sent, and send the route information to the packet framer 408, which generates the BIST packets. In some embodiments, the same test pattern is sent over all applicable routes, while in other embodiments, different test patterns may be sent over different subsets of the routes. The packet framer 408 creates the packets using the test patterns and packet sizes programmed by the NOC design tool. By adding the route information to the packets that include the tests pattern, the packet framer 408 is able to create protocol-agnostic BIST packets.

The NOC design tool may create a unique routing table parameter for each BIST generator 106 which indicates how many routes the BIST generator has and how many flits the packets that are sent through that route will contain in order to fully test all wires and storage elements of the route. The same NOC design tool may also program a parameter into the BIST generator 106 indicating the number of test patterns to send, the test pattern width, and the data of each of the test patterns.

In an embodiment, the traffic pattern from each BIST generator 106 is encoded in the routing table 412 with various fields, such as one or more of a strap_id, profile_id, index, routing information, destination_interface, first_port, virtual channel, number_of_flits, and eop_cell_valid.

The strap_id may be used to support multiple instances of the same repeated logic block (e.g., the BIST generator 106 or the BIST checker 108) in system 100. As one example, the NOC design tool may generate the same HDL (e.g., RTL) group for use in multiple layout partitions for different instances of the BIST generator 106 or BIST checker 108. In some embodiments, multiple BIST generators 106 (e.g., all BIST generators 106 of the system 100 or a subset of the BIST generators 106) may have identical routing tables. These routing tables may include the routes used by multiple BIST generators and thus, for a particular BIST generator 106, may include the routes that the BIST generator 106 uses as well as additional routes that the BIST generator will not use (because they are routes for one or more other BIST generators 106). The NOC design tool may configure a unique strap value for each instance of the BIST generator 106 so that the routes that are specific to that instance of the BIST generator 106 may be accessed by the BIST generator based on the strap value (e.g., the routes having a strap_id entry that match the strap value may be used). The strap value could be provided to the BIST generator 106 or BIST checker 108 in any suitable manner. For example, the strap value may be stored in a register within or coupled to the BIST generator 106 or BIST checker 108.

When there are multiple profiles, the profile_id field is used to select between different sets of packets to send in each profile. Thus, the profile_id may be used to select the particular routes of the BIST generator 106 that are to be tested during a BIST run. For example, a default value for the profile (e.g., zero) may indicate that the entire NOC (e.g., all routes between all agents) are to be tested (e.g., this may be used during manufacturing BIST testing). Other profile values may represent various subsets of the NOC routes that may be tested during a BIST run. In some embodiments, these other profiles may be configured by design architects at the time of the creation of the system 100 (e.g., by specifying the profiles using the NOC design tool). As one example, a particular profile value may correspond to a mission critical subset of the system 100 which must be intermittently verified by running BIST in deployed functional safety (FUSA) applications. As another example, a different profile value may correspond to a different subset of the system 100.

In a particular embodiment, the profile_id may be stored in a register of switch 110 that is coupled to (e.g., the switch 110 adjacent to) the BIST generator 106. The register may also be coupled to the corresponding BIST checker 108 to provide the profile_id to the BIST checker 108 as well. Switches 110 may each have a register to store the profile_id provided to a respective BIST generator 106 and BIST checker 108 set. In other embodiments, a single register could store the profile_id that is provided to all BIST generators 106 and BIST checkers 108. In various embodiments, the register(s) storing the profile_id may be located within any other suitable component(s) of system 100. The registers storing the profile_id may be written to by software executed (e.g., by a CPU) by system 100 to configure each BIST generator 106 and BIST checker 108 to the same profile before a new BIST run is initiated (e.g., by writing to the BIST enable register 208).

In some embodiments, the strap_id and profile_id are concatenated together, and the result is used as a key by the BIST generator 106 to index into the routing table 412 to access only the routes applicable to this specific instance of the BIST generator 106 that are included within the routes to be tested during the BIST run for the profile corresponding to the profile_id.

The index represents a counter value. For each strap_id and profile_id pair, a number N of tests packets may be sent during a BIST run. The index may correspond to one of these packets and thus may have a value from 0 to N−1 to make it easy to select the packets that need to be sent in order. Each index value is associated with corresponding routing information for the route over which the packet is to be sent. Although any suitable routing information may be used, in some embodiments, the route information includes a route, a destination interface, a first port, and a virtual channel.

The routing information may comprise control information that may be used to one or more components (e.g., switches, routers) of the NOC to direct a packet from its source to its destination. In an embodiment utilizing source-based routing, the routing information may comprise a bitstring encoding the path through the NOC. The bitstring may be a compressed form of the path through the transport infrastructure and may encode which output port to use at each NOC component that has multiple output ports. In an embodiment utilizing destination-based routing, the routing information may simply comprise a destination identifier and each component of the NOC may determine the output port to send the packet based on the destination identifier. Other embodiments may utilize any suitable routing scheme and routing information.

In some embodiments, the routing information includes the route, destination_interface, first_port, and virtual_channel fields collectively forming the instructions that the NOC will use to get the corresponding packet to its correct destination. In some embodiments, every message through the NOC may be assigned a virtual channel (e.g., a BIST packet may be assigned a virtual channel as indicated by the virtual_channel field). When a packet reaches a component of the NOC (e.g., a router), the packet may be placed in a buffer associated with the virtual channel.

The number_of_flits value represents the number of flits in the packet to be transmitted along the corresponding path. In various embodiments, a packet may be split into multiple flow control units ("flits") or a packet may comprise a single flit. In some instances, a flit may embody a defined amount or quantum of data to be sent over the data channels. A flit may carry a portion of a packet or other quantum of data over the data channel.

When the last flit is sent, the eop_cell_valid value is used to indicate to the NoC what fraction of the last flit is valid.

Arbiter 406 arbitrates between BIST packets generated by packet generator 402 and regular NOC traffic from the attached agent 104 (e.g., from a bridge of the agent) on packet boundaries. During manufacturing testing, there will likely be no regular NOC traffic, but in a deployed system, regular NOC traffic will likely be present, unless BIST is run while the system 100 is idle. Arbiter 406 may use any suitable arbitration scheme such as round robin, weighted round robin, or strict priority. In some embodiments, arbiter 406 may have rate limiting capabilities for either the BIST traffic or the regular NOC traffic. In various embodiments, the arbiter 406 could prioritize or deprioritize the BIST traffic.

The BIST signaling handshaker 404 comprises a small state machine that controls the BIST generator 106's handshake with the BIST controller 101. The handshaker 404 may move to an active state when the BIST_ENABLE signal is asserted. In the active state, the handshaker 404 may assert the BIST_ACTIVE signal to prompt the packet generator 402 to begin packet generation and may assert the BIST_ACK signal to indicate to the BIST controller 101 that the BIST_ENABLE signal has been received. The handshaker 404 then waits for the DONE signal from packet generator 402 to be asserted. In response, the handshaker 404 asserts the BIST_DONE signal and then moves back to an inactive state.

Figure 5:
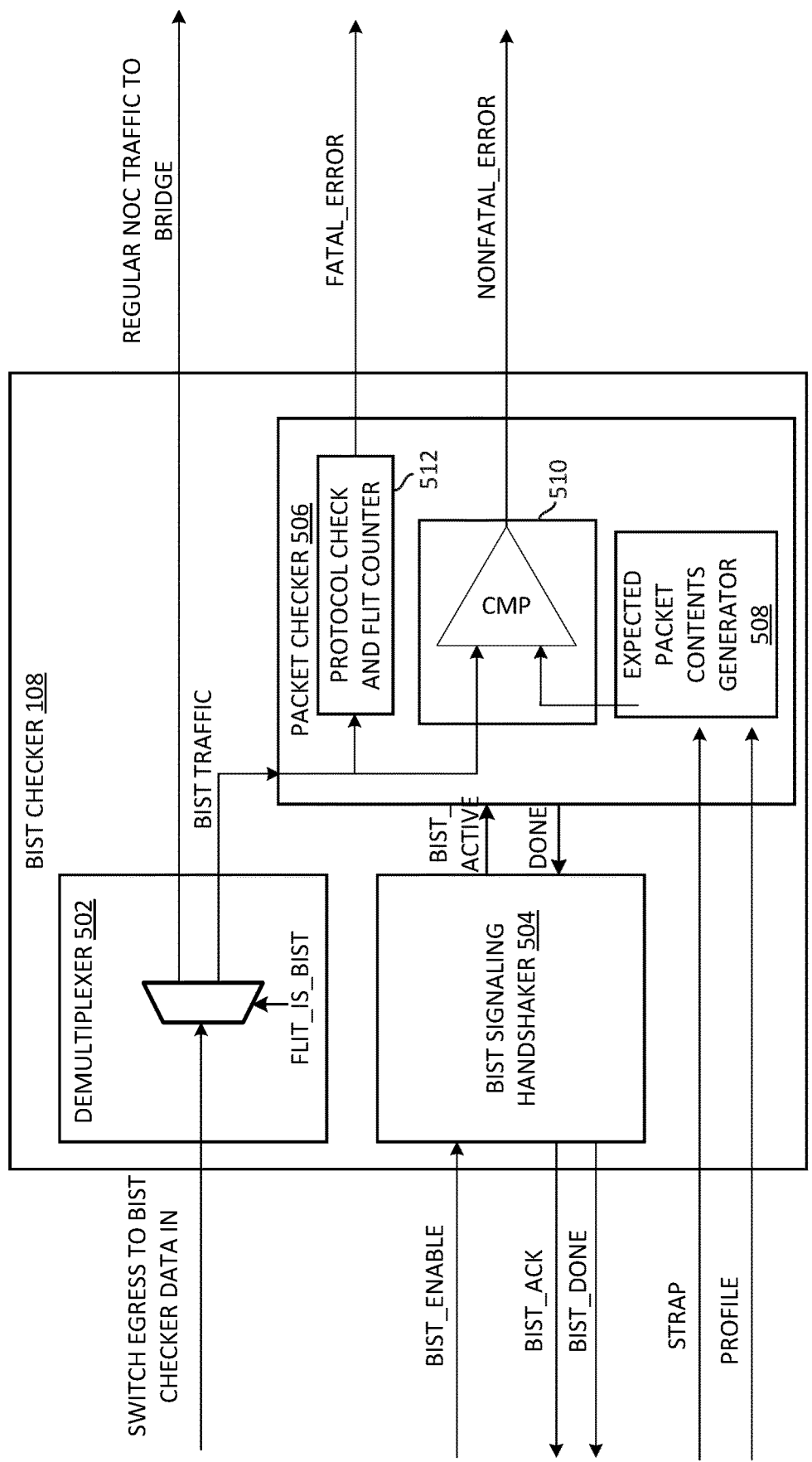
FIG. 5 illustrates a BIST checker in accordance with various embodiments.

FIG. 5 illustrates a BIST checker 108 in accordance with various embodiments. BIST checker 108 includes a demultiplexer (demux) 502, a BIST signaling handshaker 504, and a packet checker 506. The packet checker 506 includes an expected packet contents generator 508, comparison circuitry 510, and a protocol check and flit counter 512.

The NOC design tool may instantiate and configure BIST checkers 108 on the RX links between switches 110 and their attached agents 104 (e.g., coupled to bridges of the agents). The NOC design tool may also modify the NOC fabric's internal streaming protocol to support BIST, by inserting a one-bit signal (FLIT_IS_BIST) to the fabric interface definition. Thus, paths through the NOC on which BIST packets may be sent may include an extra wire (or wire pair if differential signaling is used for this signal) dedicated to carry this one bit signal. Thus, if BIST is enabled (e.g., by a system architect interacting with the NOC design tool) in a fabric generated by the NOC design tool, this bit is present on all NOC links in the fabric where BIST is enabled. This bit may be asserted when the other bits on a link are carrying BIST flits and deasserted for regular traffic between agents 104.

The NOC design tool may also configure each BIST checker 108 with a STRAP input, in a manner similar to that described above for the STRAP input for the BIST generators 106. The STRAP input of a BIST checker 108 could be coupled to the same register as the STRAP input of the associated BIST generator 106 or to its own dedicated register.

Similarly, like the BIST generators 106, the BIST checkers 108 each have a PROFILE input signal. The PROFILE input signal of an instance of a BIST checker 108 may be supplied by the same source as the corresponding PROFILE input signal of the corresponding instance of a BIST generator 106 or from another suitable source. In various embodiments, the PROFILE signal for an instance of a BIST checker 108 is provided through a programmable register in the switch 110 coupled to the BIST checker 108.

The packet checker 506 may use the STRAP and PROFILE signal (e.g., concatenated together) as a key to index into an expected flit count array which is programmed into the BIST checker 108 (or other suitable system component) by the NOC design tool. The expected flit count may indicate the number of flits that the BIST checker 108 is expected to receive during the BIST run (e.g., aggregated among flits sent from any of the BIST generators and across all test patterns of the BIST run).

The protocol check and flit counter 512 may perform various types of traffic checking. For example, protocol check and flit counter 512 may count incoming flits received for BIST traffic during a BIST run. If the protocol check and flit counter 512 receives more flits than the expected number of flits, it will signal a fatal error (via the FATAL_ERROR signal) to the BIST controller 101. As another example, protocol check and flit counter 512 may detect any of several different protocol violations, such as the reception of successive start-of-packet bits (SOPs) without receiving end-of-packet bits (EOPs) in between, the inverse of that, or the reception of a non-SOP flit following an EOP flit. If the protocol check and flit counter 512 receives less than the number of expected flit counts, then BIST signaling handshaker 504 will not send the BIST_DONE signal to the BIST controller 101 which may result in a timeout.

The expected packet contents generator 508 generates expected packet data for fields of the BIST packets to be received during the BIST run based on the parameterized test patterns, and uses the expected packet data to detect data corruption. Thus, the BIST checker 108 may be programmed with (or otherwise provided access to) the test patterns as well as the packet sizes (e.g., by the NOC design tool). Comparison circuitry 510 may compare received BIST packets with the generated expected packets and report a nonfatal error via the NONFATAL_ERROR signal if the packet contents do not match. Some fields (e.g., SOP, EOP, route information) do not contain a replicated test pattern (and thus are not checked by the comparison circuitry 510 in at least some embodiments) as these fields may be required to be programmed correctly in order to route the packet. If faults occur on these fields, the BIST system will still likely detect a problem because faults on these wires would lead to misrouted packets or protocol violations, thus resulting in a fatal error.

As the NOC design tool is aware of each route that a given agent 104 has to another agent 104, the maximum width of the busses in the route, and the maximum width and depth of the data storage along the route, the NOC design tool is able to calculate the appropriate packet sizes for the BIST test patterns sent by the generators 106. BIST coverage of the NOC may involve covering (e.g., sending test patterns through) all of the wires, virtual channel (VC) buffers and multiplexers (muxes).

To cover a bundle of wires (e.g., of a bus) between two transport components of the NOC, the BIST system may drive each BIST pattern onto that bundle of wires and verify that it is transported correctly. To do this, the BIST generators 106 are programmed (e.g., by the NOC design tool) to send BIST packets of all patterns on all edges of the NOC. Furthermore, the NOC design tool may ensure that those packets are at least as large as the number of wires (since if the packet is smaller, some wires won't be tested).

To cover a transport mux, the BIST system may write each BIST pattern on each input of the mux with that input selected to go to the mux output, and ensure the pattern is propagated correctly. To do this, the BIST system may send a flit from each input of the mux to each output of the mux. If the packet is shorter than the mux width, the packet will not test the fraction of the mux that isn't driven. To cover a mux, the BIST system will send a packet that is at least as large as the width of the mux (where the width of the mux is generally equal to the width of the widest VC buffer that the mux sends data to).

In practice, wire coverage and mux coverage is usually provided by adequate buffer coverage, but extra considerations may be used by the NOC design tool to ensure that appropriate BIST packets are sent from each input port to each output port of each router. In some embodiments, this may be achieved by sending BIST packets along each path in the NOC.

To cover a VC buffer, the BIST system may write each BIST pattern to each entry of the buffer and ensure it is read out correctly. Although the endpoints may not be able to control which buffer entry a packet will be written to, the VC buffers may be implemented using circular arrays, and thus each flit may write to the next buffer entry. This may provide a guarantee that each entry of the buffer is written to as long as the number of flits sent through the buffer is at least as large as the number of buffer entries. However, if fewer BIST packets are sent through a buffer, the coverage may not be complete as the packets may not write to each entry of the buffer. Moreover, interleaving of packets from different BIST generators 106 within a buffer may warrant special considerations to achieve full coverage of the buffer.

Figure 6:
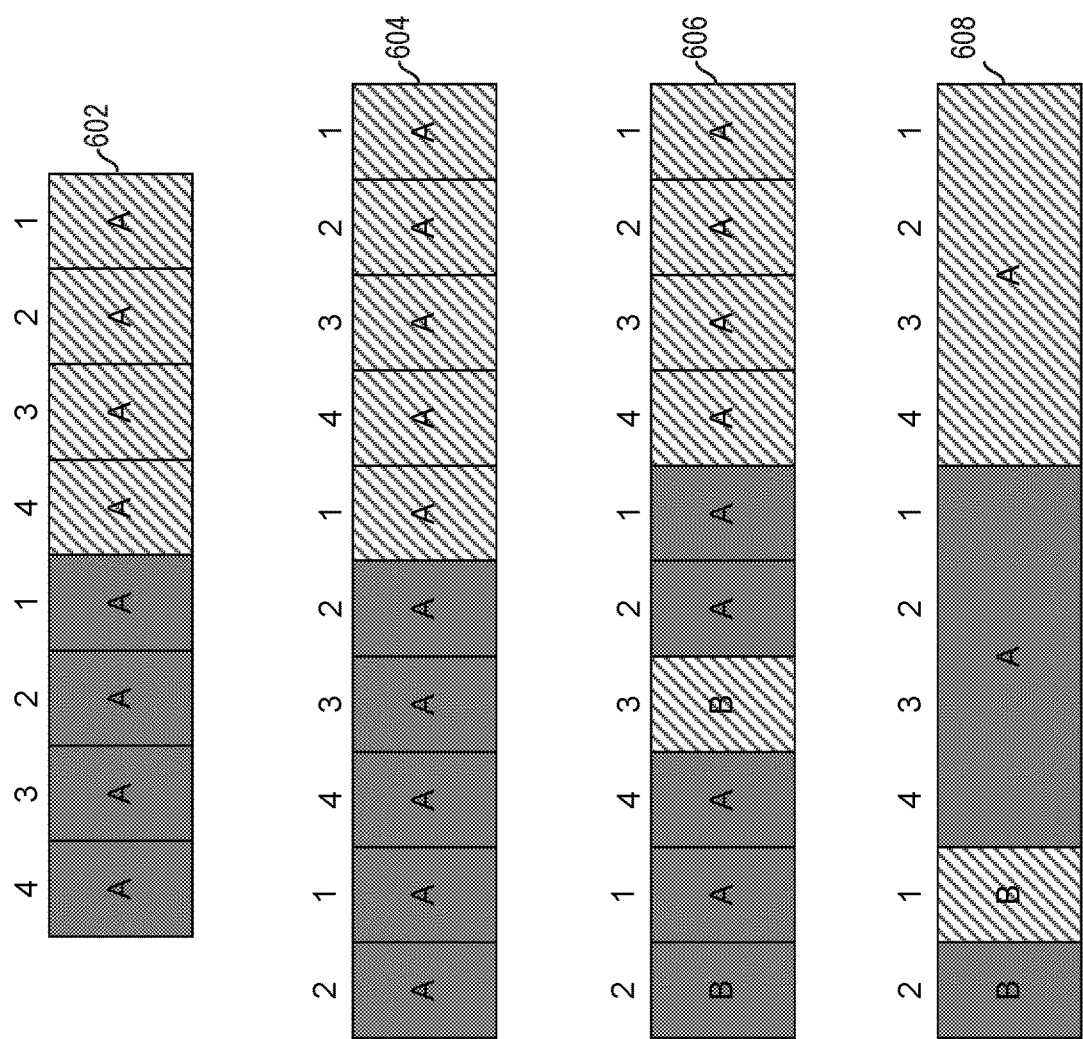
FIG. 6 illustrates various buffer storage sequences in accordance with various embodiments.

FIG. 6 illustrates various buffer storage sequences in accordance with various embodiments. Buffer coverage may be more complex than wire and mux coverage because coverage of a buffer may require multiple flits to go through the buffer in the right sequence, whereas wires and muxes can be completely covered by single-flit events.

As an illustration, buffer storage sequence 602 illustrates a storage sequence of a 4-entry buffer over time. In some embodiments, the buffer may be a first in first out (FIFO) virtual channel (VC) buffer. When only one BIST generator sends packets that pass through the buffer, the BIST generator can send 4 single-flit packets of the first pattern, and 4 of the second pattern. In the buffer storage sequence 602, "1, 2, 3, 4" indicate buffer entries. Each box represents a flit being sent (the first flit sent is on the right and the last flit sent is on the left). The letter designation (e.g., "A") inside each box indicates the BIST generator (e.g., BIST generator "A") that generated the flit, and different shading indicates different test patterns. The first four flits that are sent have the same pattern and are sent by BIST generator A, so that pattern will be written to each buffer entry in sequence. The second four flits that are sent are of a different pattern and are also sent by BIST generator A. Thus, the second four flits will test the same four buffer entries using the second pattern, so all buffer entries will see each pattern.

Buffer storage sequence 604 illustrates a scenario where the BIST generator A sends 5 single-flit packets of each pattern. Even though the packets do not align with the buffer entries, each buffer entry will have each pattern written to it so the buffer will be covered.

During a BIST run, a buffer may store packets generated by multiple BIST generators (e.g., BIST generator "B" may also send BIST packets to the buffer). Buffer storage sequence 606 shows the buffer in a scenario in which BIST generator B sends a single packet of each pattern through the buffer, while BIST generator A sends four packets of each pattern through the buffer. In this scenario, the first packet from BIST generator B could arrive at the buffer after several packets from BIST generator A have arrived. The buffer may be allowed to interleave packets from different sources, so the packet of the first pattern from BIST generator B may be written to buffer entry 3. This may create a coverage hole as buffer entry 3 would only have the first pattern written to it and would fail to be checked by the second pattern.

In various embodiments, the NOC design tool may configure one or more BIST generators to send multi-flit packets instead of single-flit packets to ensure buffer coverage. In some embodiments, a buffer (e.g., a VC buffer) is not permitted to interleave flits of different packets, so the pattern of flits being written to the buffer may take the form shown in buffer storage sequence 608. The larger boxes indicate that a single large packet of the various patterns can test a buffer entry for a particular pattern. When a BIST generator sends multi-flit packets, the flits of those packets are not interleaved in a buffer with the flits of any other packet, thus guaranteeing that the packet is written to consecutive buffer entries. Thus, transmission of a single large packet (per pattern) whose size matches the size of the buffer (e.g., each entry of the buffer may store a flit of the packet with each flit including the test pattern) may avoid the packet interleaving problem described above and ensure coverage through the buffer.

The above coverage analysis assumes buffers are homogenous in structure, with all bits in the buffer undergoing the same transport from source to destination. In many networks, flits (and therefore buffers), are divided into a header portion and a body portion. In such instances, the body may undergo width conversion, with a single flit splitting into multiple flits for transport across narrower links, or multiple flits becoming one flit for transport on a wider link. While the body changes flit width, the header may remain at a fixed width. This usually results in header bits being dropped (for narrow to wide conversion) and duplicated (for wide to narrow conversion), which may interfere with the BIST system's ability to transport the value read from the header buffer storage to the BIST checker 108 for validation. For paths with width conversion, the NOC design tool may configure the appropriate BIST generator(s) 106 to send smaller packets that will not undergo width conversion so that the sideband information written in one buffer always makes it to the destination.

Buffers may also be heterogenous when packets having different structures use different subsets of the buffer storage. This may result in packets that include byte-valid information using the same buffers as packets that do not have byte-valid information, allowing both types of packets to share the same path and be width-converted without corruption. Flits (and correspondingly, buffers) may be thought of as having independent data lanes. In this example, the data would be in one lane and the byte-valid information would be in a separate lane. When the transport layer being tested by a BIST system has multiple lanes, the BIST system (e.g., through configuration by the NOC design tool) may ensure that the storage for all lanes is checked. In a scenario in which a particular source (e.g., agent 104) can send a packet that uses all lanes present in a buffer, the BIST generator 106 associated with that source is used for checking that buffer. If no source can send packets that use all lanes, then different BIST generators 106 may send packets that together will cover all the data lanes. Sending packets that fill the buffer from BIST generators 106 associated with each source will ensure coverage of the lanes that packet uses in all buffer entries.

The different coverage requirements of buffers illustrated above indicate the difficulty of achieving coverage in a network where packets from different sources can interleave in a buffer. In some embodiments, a technique referred to as BIST-Only VC Locking (BOVL) may be utilized to resolve these difficulties. BOVL utilizes the FLIT_IS_BIST control signal to prevent interleaving of BIST packets from different BIST generators 106 within a single buffer. This allows small packets (which may provide sideband coverage) to be sent on specific data lanes without concern that packets from other BIST generators 106 will interleave in the buffer and prevent coverage of all buffer entries. With BOVL, a particular property of a particular buffer can be precisely targeted for BIST coverage without concern for potential interference caused by other BIST generators 106.

The FLIT_IS_BIST addition to the protocol's packet definition described above enables various BIST system enhancements. For fabrics where parity or error correction code (ECC) is utilized, it allows the BIST system to test the parity and ECC wires and storage for the parity and ECC bits themselves. Instead of generating parity and ECC bits for these wires, a BIST generator 106 may replicate the test patterns across these wires as well. As the packets with the test pattern on the parity/ECC bits are transmitted across the NOC, the parity/ECC checking and generation logic in each hop (e.g., router or switch) checks the FLIT_IS_BIST control bit, and if that bit is asserted, does not check or regenerate the parity or ECC. The parity or ECC fields that are populated by the test pattern are communicated through the NOC to the BIST checker 108 which checks for errors introduced in transit by faults.

The FLIT_IS_BIST bit allows the BIST checker 108 to always sink BIST flits (e.g., remove them from the link to the BIST checker regardless of whether the buffers of the bridge of the agent are full), preventing any backpressure onto the NOC caused by the egress of BIST packets. This feature, combined with the arbitration in the BIST generators 106, allow BIST to be run at the same time as regular traffic in all or part of a mission-mode system.

Differentiating the BIST flits from regular traffic also opens up the possibility of other reliability or FUSA testing possibilities. For example, configurable hardware enabled by a control register may be added to force parity or ECC errors onto BIST packets in order to verify that the detection and reporting logic functions correctly. This could be done in a mission-mode SOC without impacting real NOC traffic. For example, if BIST was executed intermittently in mission mode operation in a computing system of a vehicle, a bit can be set in a register so that when BIST is active, logic may force a parity or ECC bit error on a flit in order to test the parity or ECC reporting functionality.

In various embodiments, the NOC design tool may also be able to identify BIST packets it may omit without decreasing coverage. When sending packets through the NOC, a single BIST generator routing table entry can cover up to all the buffers along its path. Covering a single buffer by more than one packet may increase test time without significant extra coverage. The naive strategy of sending enough BIST packets on each path to ensure that everything on that path is covered will guarantee full coverage, but will generally not be optimal in runtime as some packets may overlap coverage. Depending on the structure of the network, the NOC design tool may achieve full coverage through transmission of a fraction of the BIST packets. In one embodiment, the NOC design tool may identify BIST packets that may be removed without decreasing coverage and remove the BIST generator routing table entries for these packets from a set of routing table entries that is initially generated by the NOC design tool. In some embodiments, the NOC design tool may optimize the size of BIST packets to not always cover the largest buffer on their path, but to cover the largest buffer on their path that has not yet been covered by the packets that have been configured for the BIST generators. These techniques may reduce test time by reducing the amount of network resources consumed by individual BIST packets. In various embodiments, BIST packets can be reordered by the NOC design tool to minimize contention and increase parallelism. If two BIST generators 106 are configured to send very large packets down the same path at the same time, one of those packets may have to wait for the other to progress, and it may block one of the BIST generators from sending packets on other paths. The NOC design tool may detect such scenarios and their effects by running simulations, noting which packets contend for resources, and re-scheduling those packets to times when those resources aren't under contention.

Figure 7:
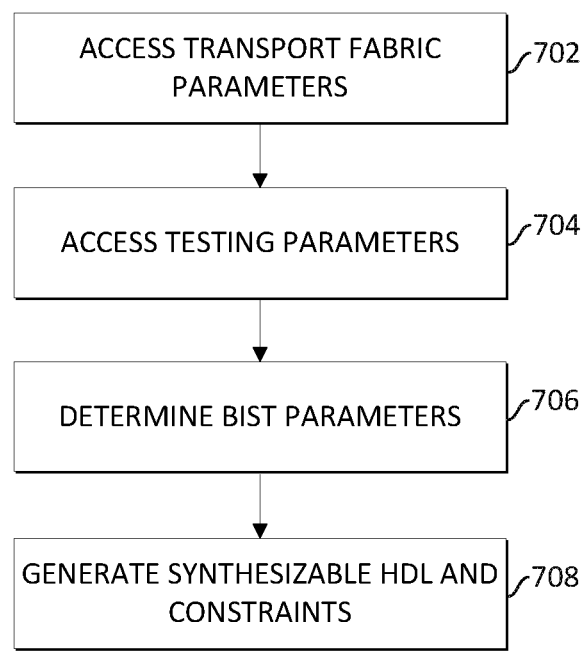
FIG. 7 illustrates a flow for generating HDL comprising a NOC with a BIST system in accordance with various embodiments.

FIG. 7 illustrates a flow for generating synthesizable HDL comprising a NOC and a BIST system in accordance with various embodiments. In various embodiments, all or a portion of the flow may be performed by a NOC design tool or other suitable logic.

At 702, access transport fabric parameters are accessed. Such parameters may specify requirements for a NOC to be generated. Such parameters may include, e.g., any one or more of the agents to communicate over the NOC, which protocols are to be used by the agents, bandwidth requirements of the agents, latency requirements of the agents, which agents are connected to which other agents, data widths of the agents, burst sizes for the agents, and packet sizes for the agents.

At 704, testing parameters are accessed. Such parameters may specify requirements associated with a BIST system to test a NOC. For example, such parameters may include specifications of different testing profiles, where a testing profile specifies what portions of the NOC are to be tested during a BIST run corresponding to that testing profile. In various embodiments, one testing profile may specify all possible routes between the agents specified in the transport fabric parameters while one or more other testing profiles may specify distinct subsets of the routes. In some embodiments, the testing parameters may include a specification of one or more test patterns that are to be sent to test routes through the NOC. In various embodiments, the NOC design tool may natively provide several tests patterns and a user may select which test patterns are to be run for each BIST run (or for may specify a first set of test patterns to run for a particular testing profile, a second set of test patterns to run for a different testing profile, and so on).

At 706, BIST system parameters are determined. For example, such parameters may include any one or more of BIST generator and BIST checker locations and connectivity, BIST generator routing table entries, packet widths, test packet sequences, other BIST system parameters described herein, or other suitable BIST system parameters.

At 708, synthesizable HDL and associated constraints are generated based on one or more of the transport fabric parameters, the testing parameters, and the BIST system parameters to generate a NOC and a BIST system suitable to test the NOC. The synthesizable HDL and associated constraints may in turn be used to generate the physical circuits of the NOC and BIST system.

Figure 8:
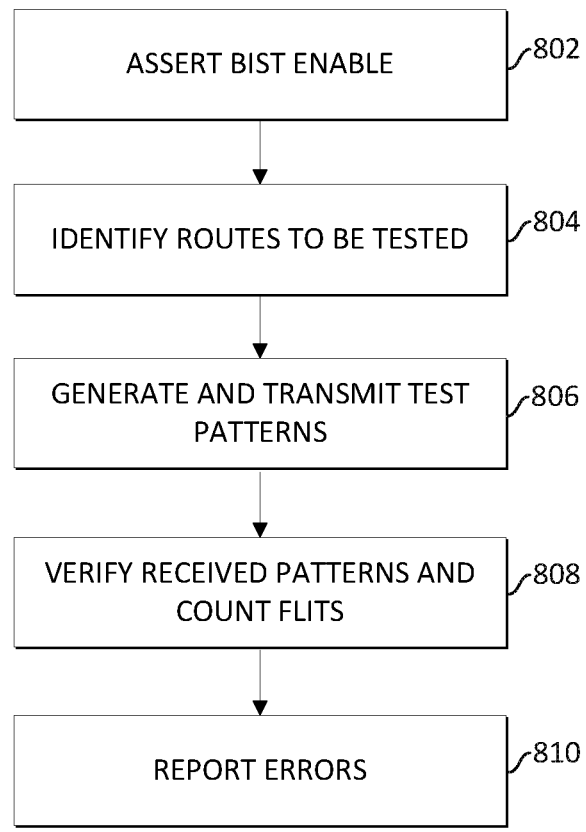
FIG. 8 illustrates a flow for performing a BIST run in accordance with various embodiments.

FIG. 8 illustrates a flow for performing a BIST run in accordance with various embodiments. The flow may be performed by computing system 100 or other suitable logic.

At 802, a BIST_ENABLE signal is asserted (e.g., responsive to a BIST_ENABLE register being written to). The BIST_ENABLE signal may be sent to a plurality of BIST generators and BIST checkers to initiate a BIST run.

At 804, a plurality of routes to be tested are identified. In some embodiments, the routes may be identified based on a profile ID that is used as an index into routing tables of the BIST generators. In various embodiments, the index into the routing tables may also include a strap ID that may be used along with the profile ID to index into the routing tables.

At 806, packets including test patterns are generated and transmitted over the routes to be tested by the BIST generators. At 808, BIST checkers receive the packets and verify the received patterns and count flits within the received packets. At 810, the BIST checkers report any errors detected based on the received packets and expected results.

Although the embodiments herein may be described with reference to specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from the features described herein. For example, the disclosed embodiments are not limited to being included within particular host devices or peripheral devices, but may be included within or implemented by any suitable host or peripheral devices such as desktop computer systems, server computer systems, handheld devices, tablets, other thin notebooks, systems on a chip (SoC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatuses, methods, and systems described herein are not limited to physical computing devices, but may also relate to software optimizations.

Figure 9:
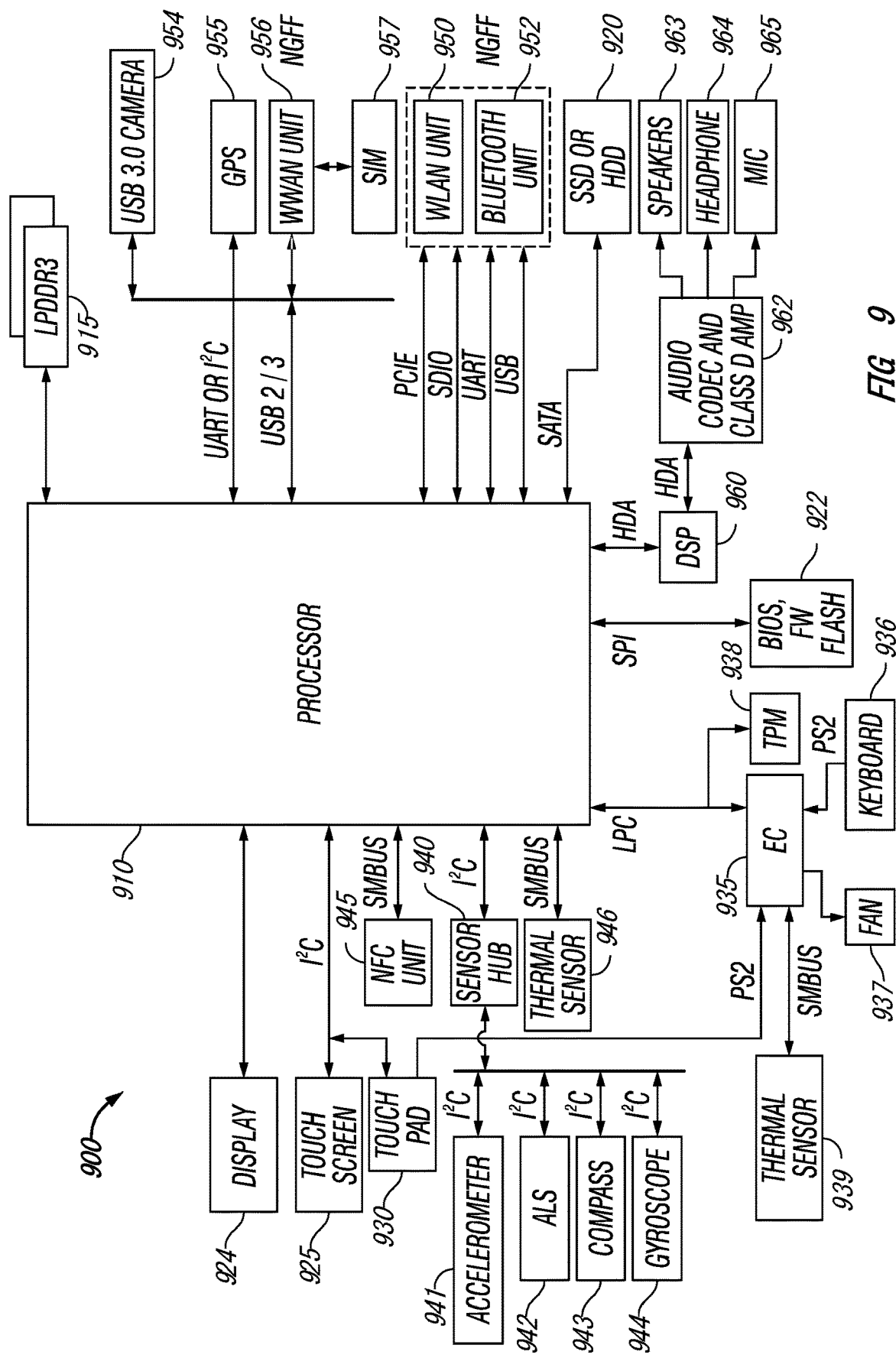
FIG. 9 illustrates a block diagram of components present in a computing system in accordance with various embodiments.
Figure 10:
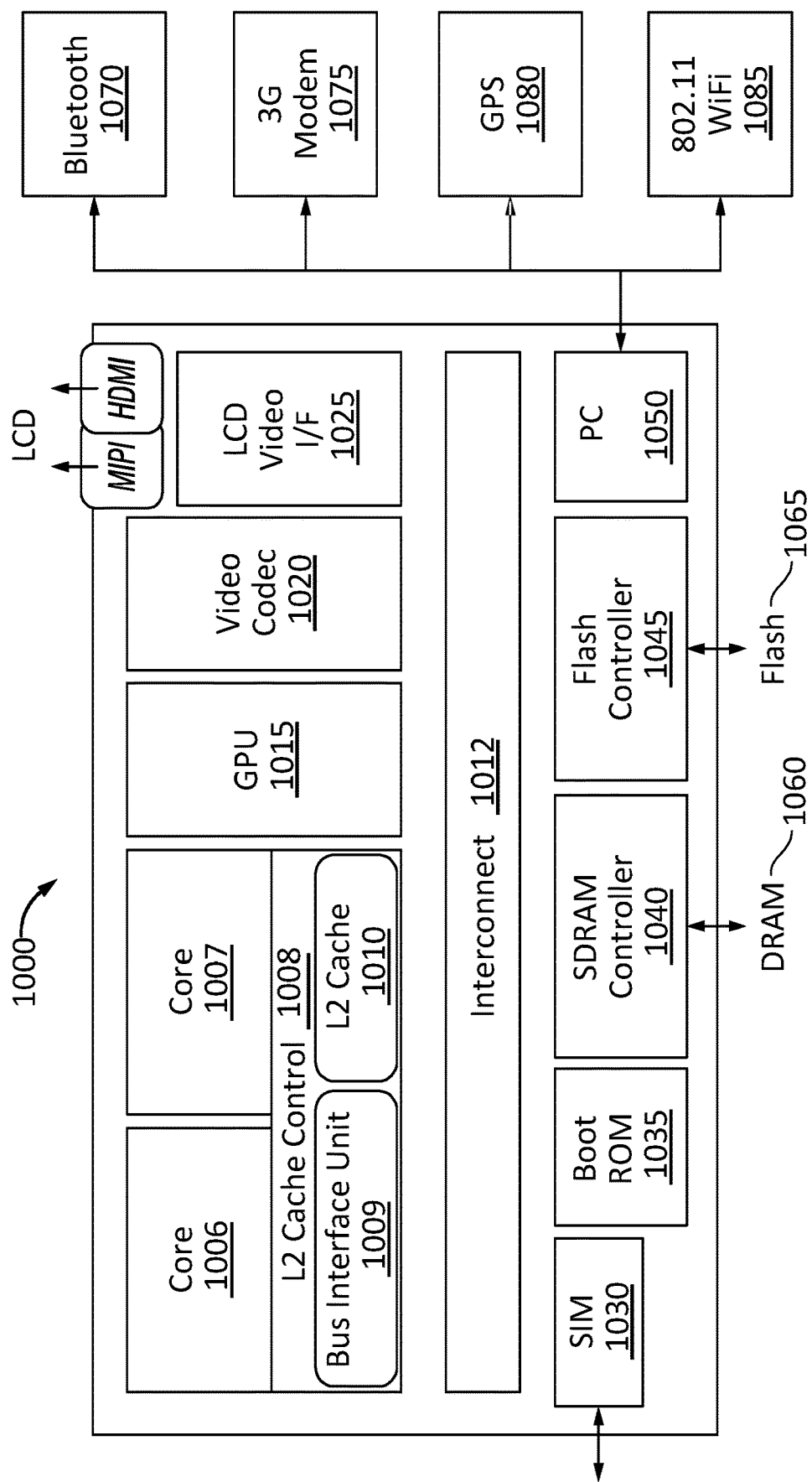
FIG. 10 illustrates a block diagram of another computing system in accordance with various embodiments.

FIGS. 9 and 10 depict example systems in which various embodiments described herein may be implemented. For example, any of the systems depicted (or portions thereof) could implement the NOC design tool or the computing system 100.

Referring now to FIG. 9, a block diagram of components present in a computer system that may function as either a host device or a peripheral device (or which may include both a host device and one or more peripheral devices) in accordance with certain embodiments is described. As shown in FIG. 9, system 900 includes any combination of components. These components may be implemented as ICs, portions thereof, discrete electronic devices, or other modules, logic, hardware, software, firmware, or a combination thereof adapted in a computer system, or as components otherwise incorporated within a chassis of the computer system. Note also that the block diagram of FIG. 9 is intended to show a high level view of many components of the computer system. However, it is to be understood that some of the components shown may be omitted, additional components may be present, and different arrangement of the components shown may occur in other implementations. As a result, the disclosure described above may be implemented in any portion of one or more of the interconnects illustrated or described below.

As seen in FIG. 9, a processor 910, in one embodiment, includes a microprocessor, multi-core processor, multi-threaded processor, an ultra low voltage processor, an embedded processor, or other known processing element. In the illustrated implementation, processor 910 acts as a main processing unit and central hub for communication with many of the various components of the system 900. As one example, processor 910 is implemented as a system on a chip (SoC). As a specific illustrative example, processor 910 includes an Intel® Architecture Core™-based processor such as an i3, i5, i7 or another such processor available from Intel Corporation, Santa Clara, CA However, other low power processors such as those available from Advanced Micro Devices, Inc. (AMD) of Sunnyvale, CA, a MIPS-based design from MIPS Technologies, Inc. of Sunnyvale, CA, an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. Note that many of the customer versions of such processors are modified and varied; however, they may support or recognize a specific instructions set that performs defined algorithms as set forth by the processor licensor. Here, the microarchitecture implementation may vary, but the architectural function of the processor is usually consistent. Certain details regarding the architecture and operation of processor 910 in one implementation will be discussed further below to provide an illustrative example.

Processor 910, in one embodiment, communicates with a system memory 915. As an illustrative example, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices may be of different package types such as single die package (SDP), dual die package (DDP) or quad die package (QDP). These devices, in some embodiments, are directly soldered onto a motherboard to provide a lower profile solution, while in other embodiments the devices are configured as one or more memory modules that in turn couple to the motherboard by a given connector. And of course, other memory implementations are possible such as other types of memory modules, e.g., dual inline memory modules (DIMMs) of different varieties including but not limited to microDIMMs, MiniDIMMs. In a particular illustrative embodiment, memory is sized between 2 GB and 16 GB, and may be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage 920 may also couple to processor 910. In various embodiments, to enable a thinner and lighter system design as well as to improve system responsiveness, this mass storage may be implemented via a SSD. However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 9, a flash device 922 may be coupled to processor 910, e.g., via a serial peripheral interface (SPI). This flash device may provide for non-volatile storage of system software, including a basic input/output software (BIOS) as well as other firmware of the system.

In various embodiments, mass storage of the system is implemented by a SSD alone or as a disk, optical or other drive with an SSD cache. In some embodiments, the mass storage is implemented as a SSD or as a HDD along with a restore (RST) cache module. In various implementations, the HDD provides for storage of between 320 GB-4 terabytes (TB) and upward while the RST cache is implemented with a SSD having a capacity of 24 GB-256 GB. Note that such SSD cache may be configured as a single level cache (SLC) or multi-level cache (MLC) option to provide an appropriate level of responsiveness. In a SSD-only option, the module may be accommodated in various locations such as in a mSATA or NGFF slot. As an example, an SSD has a capacity ranging from 120 GB-1 TB.

Various input/output (IO) devices may be present within system 900. Specifically shown in the embodiment of FIG. 9 is a display 924 which may be a high definition LCD or LED panel configured within a lid portion of the chassis. This display panel may also provide for a touch screen 925, e.g., adapted externally over the display panel such that via a user's interaction with this touch screen, user inputs can be provided to the system to enable desired operations, e.g., with regard to the display of information, accessing of information and so forth. In one embodiment, display 924 may be coupled to processor 910 via a display interconnect that can be implemented as a high performance graphics interconnect. Touch screen 925 may be coupled to processor 910 via another interconnect, which in an embodiment can be an I2C interconnect. As further shown in FIG. 9, in addition to touch screen 925, user input by way of touch can also occur via a touch pad 930 which may be configured within the chassis and may also be coupled to the same I2C interconnect as touch screen 925.

The display panel may operate in multiple modes. In a first mode, the display panel can be arranged in a transparent state in which the display panel is transparent to visible light. In various embodiments, the majority of the display panel may be a display except for a bezel around the periphery. When the system is operated in a notebook mode and the display panel is operated in a transparent state, a user may view information that is presented on the display panel while also being able to view objects behind the display. In addition, information displayed on the display panel may be viewed by a user positioned behind the display. Or the operating state of the display panel can be an opaque state in which visible light does not transmit through the display panel.

In a tablet mode the system is folded shut such that the back display surface of the display panel comes to rest in a position such that it faces outwardly towards a user, when the bottom surface of the base panel is rested on a surface or held by the user. In the tablet mode of operation, the back display surface performs the role of a display and user interface, as this surface may have touch screen functionality and may perform other known functions of a conventional touch screen device, such as a tablet device. To this end, the display panel may include a transparency-adjusting layer that is disposed between a touch screen layer and a front display surface. In some embodiments the transparency-adjusting layer may be an electrochromic layer (EC), a LCD layer, or a combination of EC and LCD layers.

In various embodiments, the display can be of different sizes, e.g., an 11.6" or a 13.3" screen, and may have a 16:9 aspect ratio, and at least 300 nits brightness. Also the display may be of full high definition (HD) resolution (at least 1920×1080p), be compatible with an embedded display port (eDP), and be a low power panel with panel self refresh.

As to touch screen capabilities, the system may provide for a display multi-touch panel that is multi-touch capacitive and being at least 5 finger capable. And in some embodiments, the display may be 10 finger capable. In one embodiment, the touch screen is accommodated within a damage and scratch-resistant glass and coating (e.g., Gorilla Glass™ or Gorilla Glass 2™) for low friction to reduce "finger burn" and avoid "finger skipping". To provide for an enhanced touch experience and responsiveness, the touch panel, in some implementations, has multi-touch functionality, such as less than 2 frames (30 Hz) per static view during pinch zoom, and single-touch functionality of less than 1 cm per frame (30 Hz) with 200 ms (lag on finger to pointer). The display, in some implementations, supports edge-to-edge glass with a minimal screen bezel that is also flush with the panel surface, and limited IO interference when using multi-touch.

For perceptual computing and other purposes, various sensors may be present within the system and may be coupled to processor 910 in different manners. Certain inertial and environmental sensors may couple to processor 910 through a sensor hub 940, e.g., via an I2C interconnect. In the embodiment shown in FIG. 9, these sensors may include an accelerometer 941, an ambient light sensor (ALS) 942, a compass 943 and a gyroscope 944. Other environmental sensors may include one or more thermal sensors 946 which in some embodiments couple to processor 910 via a system management bus (SMBus) bus.

Using the various inertial and environmental sensors present in a platform, many different use cases may be realized. These use cases enable advanced computing operations including perceptual computing and also allow for enhancements with regard to power management/battery life, security, and system responsiveness.

For example, with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second the screen provides visual feedback to the user that the user has transitioned into a new state. Transition to a third screen may occur in a third state in which the user has confirmed recognition of the user.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

Also seen in FIG. 9, various peripheral devices may couple to processor 910. In the embodiment shown, various components can be coupled through an embedded controller 935. Such components can include a keyboard 936 (e.g., coupled via a PS2 interface), a fan 937, and a thermal sensor 939. In some embodiments, touch pad 930 may also couple to EC 935 via a PS2 interface. In addition, a security processor such as a trusted platform module (TPM) 938 in accordance with the Trusted Computing Group (TCG) TPM Specification Version 1.2, dated Oct. 2, 2003, may also couple to processor 910 via this LPC interconnect. However, understand the scope of the present disclosure is not limited in this regard and secure processing and storage of secure information may be in another protected location such as a static random access memory (SRAM) in a security coprocessor, or as encrypted data blobs that are only decrypted when protected by a secure enclave (SE) processor mode.

In a particular implementation, peripheral ports may include a high definition media interface (HDMI) connector (which can be of different form factors such as full size, mini or micro); one or more USB ports, such as full-size external ports in accordance with the Universal Serial Bus (USB) Revision 3.2 Specification (September 2017), with at least one powered for charging of USB devices (such as smartphones) when the system is in Connected Standby state and is plugged into AC wall power. In addition, one or more Thunderbolt™ ports can be provided. Other ports may include an externally accessible card reader such as a full size SD-XC card reader and/or a SIM card reader for WWAN (e.g., an 8 pin card reader). For audio, a 3.5 mm jack with stereo sound and microphone capability (e.g., combination functionality) can be present, with support for jack detection (e.g., headphone only support using microphone in the lid or headphone with microphone in cable). In some embodiments, this jack can be re-taskable between stereo headphone and stereo microphone input. Also, a power jack can be provided for coupling to an AC brick.

System 900 can communicate with external devices in a variety of manners, including wirelessly. In the embodiment shown in FIG. 9, various wireless modules, each of which can correspond to a radio configured for a particular wireless communication protocol, are present. One manner for wireless communication in a short range such as a near field may be via a near field communication (NFC) unit 945 which may communicate, in one embodiment with processor 910 via an SMBus. Note that via this NFC unit 945, devices in close proximity to each other can communicate. For example, a user can enable system 900 to communicate with another portable device such as a smartphone of the user via adapting the two devices together in close relation and enabling transfer of information such as identification information payment information, data such as image data or so forth. Wireless power transfer may also be performed using a NFC system.

Using the NFC unit described herein, users can bump devices side-to-side and place devices side-by-side for near field coupling functions (such as near field communication and wireless power transfer (WPT)) by leveraging the coupling between coils of one or more of such devices. More specifically, embodiments provide devices with strategically shaped, and placed, ferrite materials, to provide for better coupling of the coils. Each coil has an inductance associated with it, which can be chosen in conjunction with the resistive, capacitive, and other features of the system to enable a common resonant frequency for the system.

As further seen in FIG. 9, additional wireless units can include other short range wireless engines including a WLAN unit 950 and a Bluetooth unit 952. Using WLAN unit 950, Wi-Fi™ communications in accordance with a given Institute of Electrical and Electronics Engineers (IEEE) 802.11 standard can be realized, while via Bluetooth unit 952, short range communications via a Bluetooth protocol can occur. These units may communicate with processor 910 via, e.g., a USB link or a universal asynchronous receiver transmitter (UART) link. Or these units may couple to processor 910 via an interconnect according to a Peripheral Component Interconnect Express™ (PCIe™) protocol, e.g., in accordance with the PCI Express™ Specification Base Specification version 3.0 (published Jan. 17, 2007), or another such protocol such as a serial data input/output (SDIO) standard. Of course, the actual physical connection between these peripheral devices, which may be configured on one or more add-in cards, can be by way of the NGFF connectors adapted to a motherboard.

In addition, wireless wide area communications, e.g., according to a cellular or other wireless wide area protocol, can occur via a WWAN unit 956 which in turn may couple to a subscriber identity module (SIM) 957. In addition, to enable receipt and use of location information, a GPS module 955 may also be present. Note that in the embodiment shown in FIG. 9, WWAN unit 956 and an integrated capture device such as a camera module 954 may communicate via a given USB protocol such as a USB 2.0 or 3.0 link, or a UART or I2C protocol. Again, the actual physical connection of these units can be via adaptation of a NGFF add-in card to an NGFF connector configured on the motherboard.

In a particular embodiment, wireless functionality can be provided modularly, e.g., with a WiFi™ 802.11ac solution (e.g., add-in card that is backward compatible with IEEE 802.11abgn) with support for Windows 8 CS. This card can be configured in an internal slot (e.g., via an NGFF adapter). An additional module may provide for Bluetooth capability (e.g., Bluetooth 4.0 with backwards compatibility) as well as Intel® Wireless Display functionality. In addition NFC support may be provided via a separate device or multifunction device, and can be positioned as an example, in a front right portion of the chassis for easy access. A still additional module may be a WWAN device that can provide support for 3G/4G/LTE and GPS. This module can be implemented in an internal (e.g., NGFF) slot. Integrated antenna support can be provided for WiFi™, Bluetooth, WWAN, NFC and GPS, enabling seamless transition from WiFi™ to WWAN radios, wireless gigabit (WiGig) in accordance with the Wireless Gigabit Specification (July 2010), and vice versa.

As described above, an integrated camera can be incorporated in the lid. As one example, this camera can be a high resolution camera, e.g., having a resolution of at least 2.0 megapixels (MP) and extending to 6.0 MP and beyond.

To provide for audio inputs and outputs, an audio processor can be implemented via a digital signal processor (DSP) 960, which may couple to processor 910 via a high definition audio (HDA) link. Similarly, DSP 960 may communicate with an integrated coder/decoder (CODEC) and amplifier 962 that in turn may couple to output speakers 963 which may be implemented within the chassis. Similarly, amplifier and CODEC 962 can be coupled to receive audio inputs from a microphone 965 which in an embodiment can be implemented via dual array microphones (such as a digital microphone array) to provide for high quality audio inputs to enable voice-activated control of various operations within the system. Note also that audio outputs can be provided from amplifier/CODEC 962 to a headphone jack 964. Although shown with these particular components in the embodiment of FIG. 9, understand the scope of the present disclosure is not limited in this regard.

In a particular embodiment, the digital audio codec and amplifier are capable of driving the stereo headphone jack, stereo microphone jack, an internal microphone array and stereo speakers. In different implementations, the codec can be integrated into an audio DSP or coupled via an HD audio path to a peripheral controller hub (PCH). In some implementations, in addition to integrated stereo speakers, one or more bass speakers can be provided, and the speaker solution can support DTS audio.

In some embodiments, processor 910 may be powered by an external voltage regulator (VR) and multiple internal voltage regulators that are integrated inside the processor die, referred to as fully integrated voltage regulators (FIVRs). The use of multiple FIVRs in the processor enables the grouping of components into separate power planes, such that power is regulated and supplied by the FIVR to only those components in the group. During power management, a given power plane of one FIVR may be powered down or off when the processor is placed into a certain low power state, while another power plane of another FIVR remains active, or fully powered.

Power control in the processor can lead to enhanced power savings. For example, power can be dynamically allocated between cores, individual cores can change frequency/voltage, and multiple deep low power states can be provided to enable very low power consumption. In addition, dynamic control of the cores or independent core portions can provide for reduced power consumption by powering off components when they are not being used.

In different implementations, a security module such as a TPM can be integrated into a processor or can be a discrete device such as a TPM 2.0 device. With an integrated security module, also referred to as Platform Trust Technology (PTT), BIOS/firmware can be enabled to expose certain hardware features for certain security features, including secure instructions, secure boot, Intel® Anti-Theft Technology, Intel® Identity Protection Technology, Intel® Trusted Execution Technology (TxT), and Intel® Manageability Engine Technology along with secure user interfaces such as a secure keyboard and display.

Turning next to FIG. 10, another block diagram for an example computing system that may serve as a host device or peripheral device (or may include both a host device and one or more peripheral devices) in accordance with certain embodiments is shown. As a specific illustrative example, SoC 1000 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SoC 1000 includes 2 cores—1006 and 1007. Similar to the discussion above, cores 1006 and 1007 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 1006 and 1007 are coupled to cache control 1008 that is associated with bus interface unit 1009 and L2 cache 1010 to communicate with other parts of system 1000. Interconnect 1012 includes an on-chip interconnect, such as an IOSF, AMBA, or other interconnect discussed above, which potentially implements one or more aspects of the described disclosure.

Interconnect 1012 provides communication channels to the other components, such as a Subscriber Identity Module (SIM) 1030 to interface with a SIM card, a boot rom 1035 to hold boot code for execution by cores 1006 and 1007 to initialize and boot SoC 1000, a SDRAM controller 1040 to interface with external memory (e.g. DRAM 1060), a flash controller 1045 to interface with non-volatile memory (e.g. Flash 1065), a peripheral control 1050 (e.g. Serial Peripheral Interface) to interface with peripherals, video codecs 1020 and Video interface 1025 to display and receive input (e.g. touch enabled input), GPU 1015 to perform graphics related computations, etc. Any of these interfaces may incorporate aspects of the disclosure described herein.

In addition, the system illustrates peripherals for communication, such as a Bluetooth module 1070, 3G modem 1075, GPS 1080, and WiFi 1085. Note as stated above, a UE includes a radio for communication. As a result, these peripheral communication modules are not all required. However, in a UE some form of a radio for external communication is to be included.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, e.g., reset, while an updated value potentially includes a low logical value, e.g., set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any non-transitory mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; or other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Example 1 includes a system comprising a network-on-chip (NOC) fabric comprising a plurality of routes to communicate data between a plurality of agents; a plurality of built-in self-test (BIST) generators, wherein a BIST generator of the plurality of BIST generators is coupled between an agent of the plurality of agents and the NOC fabric and is to transmit at least one test pattern through the NOC fabric; and a plurality of BIST checkers, wherein a BIST checker of the plurality of BIST checkers is coupled between the agent of the plurality of agents and the NOC fabric and is to receive at least one test pattern through the NOC fabric from at least one of the plurality of BIST generators and to verify whether the at least one test pattern was transmitted correctly through the NOC fabric.

Example 2 includes the subject matter of Example 1, and wherein the BIST generator is to arbitrate, for transmission to the NOC fabric, between packets sent by the agent and packets generated by the BIST generator.

Example 3 includes the subject matter of any of Examples 1 and 2, and wherein a plurality of links within the NOC fabric include at least one wire dedicated to a signal to indicate whether data transmitted on the link is from an agent of the plurality of agents or from one of the BIST generators.

Example 4 includes the subject matter of any of Examples 1-3, and wherein the BIST checker is to count a number of received flits and to report an error if the number of received flits does not match a number of expected flits.

Example 5 includes the subject matter of any of Examples 1-4, and wherein the number of expected flits is a number of flits expected to be received from at least a subset of the plurality of BIST generators.

Example 6 includes the subject matter of any of Examples 1-5, and further including a BIST controller comprising a register and circuitry to notify the BIST generators and BIST checkers to initiate testing responsive to a value being written to the register.

Example 7 includes the subject matter of any of Examples 1-6, and further including a processor to request that the value be written to the register.

Example 8 includes the subject matter of any of Examples 1-7, and wherein at least two of the BIST generators each comprise a routing table identifying a second plurality of routes and the BIST generator is to select a subset of the second plurality of routes for a test based on an identifier signal associated with the subset of the second plurality of routes.

Example 9 includes the subject matter of any of Examples 1-8, and wherein the BIST generator selects one or more routes for a test based on a profile identifier signal, wherein a first value of the profile identifier signal corresponds to all of the plurality of routes and a different value of the profile identifier signal corresponds to a subset of the plurality of routes.

Example 10 includes the subject matter of any of Examples 1-9, and further including a processor coupled to the NOC fabric and at least one of a network interface controller, display, and a battery coupled to the processor.

Example 11 includes a method comprising communicating between a plurality of agents over a network-on-chip (NOC) fabric comprising a plurality of routes; utilizing a plurality of built-in self-test (BIST) generators, wherein a BIST generator of the plurality of BIST generators is coupled between an agent of the plurality of agents and the NOC fabric and is to transmit at least one test pattern through the NOC fabric; and utilizing a plurality of BIST checkers, wherein a BIST checker of the plurality of BIST checkers is coupled between the agent of the plurality of agents and the NOC fabric and is to receive at least one test pattern through the NOC fabric from at least one of the plurality of BIST generators and to verify whether the at least one test pattern was transmitted correctly through the NOC fabric.

Example 12 includes the subject matter of Example 11, and further including arbitrating, by the BIST generator for transmission to the NOC fabric, between packets sent by the agent and packets generated by the BIST generator.

Example 13 includes the subject matter of any of Examples 11 and 12, and wherein a plurality of links within the NOC fabric include at least one wire dedicated to a signal to indicate whether data transmitted on the link is from an agent of the plurality of agents or from one of the BIST generators.

Example 14 includes the subject matter of any of Examples 11-13, and further including counting, by the BIST checker, a number of received flits and reporting an error if the number of received flits does not match a number of expected flits.

Example 15 includes the subject matter of any of Examples 11-14, and wherein the number of expected flits is a number of flits expected to be received from at least a subset of the plurality of BIST generators.

Example 16 includes the subject matter of any of Examples 11-15, and further including utilizing a BIST controller comprising a register and circuitry to notify the BIST generators and BIST checkers to initiate testing responsive to a value being written to the register.

Example 17 includes the subject matter of any of Examples 11-16, and further including utilizing a processor to request that the value be written to the register.

Example 18 includes the subject matter of any of Examples 11-17, and wherein at least two of the BIST generators each comprise a routing table identifying a second plurality of routes and the BIST generator is to select a subset of the second plurality of routes for a test based on an identifier signal associated with the subset of the second plurality of routes.

Example 19 includes the subject matter of any of Examples 11-18, and further including selecting, by the BIST generator, one or more routes for a test based on a profile identifier signal, wherein a first value of the profile identifier signal corresponds to all of the plurality of routes and a different value of the profile identifier signal corresponds to a subset of the plurality of routes.

Example 20 includes the subject matter of any of Examples 11-19, and further including utilizing a processor coupled to the NOC fabric and utilizing at least one of a network interface controller, display, and a battery coupled to the processor.

Example 21 includes at least one non-transitory machine accessible storage medium having instructions stored thereon, the instructions when executed on a machine, to cause the machine to access network-on-chip (NOC) fabric parameters; and generate hardware description language representing a NOC fabric and a built-in self-test (BIST) system for the NOC fabric based on the NOC fabric parameters.

Example 22 includes the subject matter of Example 21, and wherein the NOC fabric comprises a plurality of routes to communicate data between a plurality of agents; and the BIST system comprises a plurality of built-in self-test (BIST) generators, wherein a BIST generator of the plurality of BIST generators is coupled between an agent of the plurality of agents and the NOC fabric and is to transmit at least one test pattern through the NOC fabric; and a plurality of BIST checkers, wherein a BIST checker of the plurality of BIST checkers is coupled between the agent of the plurality of agents and the NOC fabric and is to receive at least one test pattern through the NOC fabric from at least one of the plurality of BIST generators and to verify whether the at least one test pattern was transmitted correctly through the NOC fabric.

Example 23 includes the subject matter of any of Examples 21-22, the instructions when executed on the machine to cause the machine to determine at least one packet size for a packet to be generated by the BIST system based on a width of a path in the NOC fabric.

Example 24 includes the subject matter of any of Examples 21-23, the instructions when executed on the machine to cause the machine to determine at least one packet size for the BIST system based on a size of a buffer in the NOC fabric.

Example 25 includes the subject matter of any of Examples 11-24, and wherein the BIST system is to test all routes in the NOC fabric between the plurality of agents.

Example 26 includes an apparatus comprising memory to store network-on-chip (NOC) fabric parameters; and circuitry to generate hardware description language representing a NOC fabric and a built-in self-test (BIST) system for the NOC fabric based on the NOC fabric parameters.

Example 27 includes the subject matter of Example 26, and wherein the NOC fabric comprises a plurality of routes to communicate data between a plurality of agents; and the BIST system comprises a plurality of built-in self-test (BIST) generators, wherein a BIST generator of the plurality of BIST generators is coupled between an agent of the plurality of agents and the NOC fabric and is to transmit at least one test pattern through the NOC fabric; and a plurality of BIST checkers, wherein a BIST checker of the plurality of BIST checkers is coupled between the agent of the plurality of agents and the NOC fabric and is to receive at least one test pattern through the NOC fabric from at least one of the plurality of BIST generators and to verify whether the at least one test pattern was transmitted correctly through the NOC fabric.

Example 28 includes the subject matter of any of Examples 26-27, the circuitry to determine at least one packet size for a packet to be generated by the BIST generator based on a width of a path in the NOC fabric.

Example 29 includes the subject matter of any of Examples 26-28, the circuitry to determine at least one packet size for the BIST generator based on a size of a buffer in the NOC fabric.

Example 30 includes the subject matter of any of Examples 26-29, wherein the BIST system is to test all routes in the NOC fabric between the plurality of agents.

Example 31 includes a system comprising means to store network-on-chip (NOC) fabric parameters; and means to generate hardware description language representing a NOC fabric and a built-in self-test (BIST) system for the NOC fabric based on the NOC fabric parameters.

Example 32 includes the subject matter of Example 31, and wherein the NOC fabric comprises a plurality of routes to communicate data between a plurality of agents; and the BIST system comprises a plurality of built-in self-test (BIST) generators, wherein a BIST generator of the plurality of BIST generators is coupled between an agent of the plurality of agents and the NOC fabric and is to transmit at least one test pattern through the NOC fabric; and a plurality of BIST checkers, wherein a BIST checker of the plurality of BIST checkers is coupled between the agent of the plurality of agents and the NOC fabric and is to receive at least one test pattern through the NOC fabric from at least one of the plurality of BIST generators and to verify whether the at least one test pattern was transmitted correctly through the NOC fabric.

Example 33 includes the subject matter of any of Examples 31 and 32, and further including means to determine at least one packet size for a packet to be generated by the BIST generator based on a width of a path in the NOC fabric.

Example 34 includes the subject matter of any of Examples 31-33, and further including means to determine at least one packet size for the BIST generator based on a size of a buffer in the NOC fabric.

Example 35 includes the subject matter of any of Examples 31-34, and wherein the BIST system is to test all routes in the NOC fabric between the plurality of agents.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A system comprising:
    a network-on-chip (NOC) fabric comprising a plurality of routes to communicate data between a plurality of agents;
    a plurality of built-in self-test (BIST) generators, wherein a BIST generator of the plurality of BIST generators is coupled between an agent of the plurality of agents and the NOC fabric and is to transmit at least one test pattern through the NOC fabric, wherein the BIST generator is to arbitrate, for transmission to the NOC fabric, between packets sent by the agent and packets generated by the BIST generator; and
    a plurality of BIST checkers, wherein a BIST checker of the plurality of BIST checkers is coupled between the agent of the plurality of agents and the NOC fabric and is to receive at least one test pattern through the NOC fabric from at least one of the plurality of BIST generators and to verify whether the at least one test pattern was transmitted correctly through the NOC fabric.

2. The system of claim 1, wherein the BIST generator is to arbitrate, for transmission to the NOC fabric, between packets sent by the agent and packets generated by the BIST generator.

3. The system of claim 1, wherein a plurality of links within the NOC fabric include at least one wire dedicated to a signal to indicate whether data transmitted on the link is from an agent of the plurality of agents or from one of the BIST generators.

4. The system of claim 1, wherein the BIST checker is to count a number of received flits and to report an error if the number of received flits does not match a number of expected flits.

5. The system of claim 4, wherein the number of expected flits is a number of flits expected to be received from all BIST generators to transmit packets to the BIST checker during a BIST run.

6. The system of claim 1, further comprising a BIST controller comprising a register and circuitry to notify the BIST generators and BIST checkers to initiate testing responsive to a value being written to the register.

7. The system of claim 6, further comprising a processor to request that the value be written to the register.

8. The system of claim 1, wherein at least two of the BIST generators each comprise a routing table identifying a second plurality of routes and the BIST generator is to select a subset of the second plurality of routes for a test based on an identifier signal associated with the subset of the second plurality of routes.

9. The system of claim 1, wherein the BIST generator selects one or more routes for a test based on a profile identifier signal, wherein different values of the profile identifier signal correspond to different sets of routes selected from the plurality of routes.

10. The system of claim 1, further comprising a processor coupled to the NOC fabric and at least one of a network interface controller, display, and a battery coupled to the processor.

11. At least one non-transitory machine accessible storage medium having instructions stored thereon, the instructions when executed on a machine, to cause the machine to:
access network-on-chip (NOC) fabric parameters;
generate hardware description language representing a NOC fabric and a built-in self-test (BIST) system for the NOC fabric based on the NOC fabric parameters; and
determine at least one packet size for the BIST system based on at least one of a width of a path in the NOC fabric or a size of a buffer in the NOC fabric.

12. The medium of claim 11, wherein:
the NOC fabric comprises a plurality of routes to communicate data between a plurality of agents; and
the BIST system comprises:
a plurality of built-in self-test (BIST) generators, wherein a BIST generator of the plurality of BIST generators is coupled between an agent of the plurality of agents and the NOC fabric and is to transmit at least one test pattern through the NOC fabric; and
a plurality of BIST checkers, wherein a BIST checker of the plurality of BIST checkers is coupled between the agent of the plurality of agents and the NOC fabric and is to receive at least one test pattern through the NOC fabric from at least one of the plurality of BIST generators and to verify whether the at least one test pattern was transmitted correctly through the NOC fabric.

13. The medium of claim 11, the instructions when executed on the machine to cause the machine to determine at least one packet size for a packet to be generated by the BIST system based on a width of a path in the NOC fabric.

14. The medium of claim 11, the instructions when executed on the machine to cause the machine to determine at least one packet size for the BIST system based on a size of a buffer in the NOC fabric.

15. The medium of claim 12, wherein the BIST system is to test all routes in the NOC fabric between the plurality of agents.

16. An apparatus comprising:
memory to store network-on-chip (NOC) fabric parameters; and
circuitry to generate hardware description language representing a NOC fabric and a built-in self-test (BIST) system for the NOC fabric based on the NOC fabric parameters;
wherein the BIST system comprises a BIST checker that is to count a number of received flits and to report an error if the number of received flits does not match a number of expected flits.

17. The apparatus of claim 16, wherein:
the NOC fabric comprises a plurality of routes to communicate data between a plurality of agents; and
the BIST system comprises:
a plurality of built-in self-test (BIST) generators, wherein a BIST generator of the plurality of BIST generators is coupled between an agent of the plurality of agents and the NOC fabric and is to transmit at least one test pattern through the NOC fabric; and
a plurality of BIST checkers, wherein a BIST checker of the plurality of BIST checkers is coupled between the agent of the plurality of agents and the NOC fabric and is to receive at least one test pattern through the NOC fabric from at least one of the plurality of BIST generators and to verify whether the at least one test pattern was transmitted correctly through the NOC fabric.

18. The apparatus of claim 16, the circuitry to determine at least one packet size for a packet to be generated by the BIST generator based on a width of a path in the NOC fabric.

19. The apparatus of claim 16, the circuitry to determine at least one packet size for the BIST generator based on a size of a buffer in the NOC fabric.

20. The apparatus of claim 17, wherein the BIST system is to test all routes in the NOC fabric between the plurality of agents.

* * * * *